US011825666B2

(12) United States Patent
Saito et al.

(10) Patent No.: US 11,825,666 B2
(45) Date of Patent: Nov. 21, 2023

(54) IMAGING ELEMENT AND IMAGING APPARATUS

(71) Applicants: SONY CORPORATION, Tokyo (JP); SONY SEMICONDUCTOR SOLUTIONS CORPORATION, Kanagawa (JP)

(72) Inventors: Yosuke Saito, Tokyo (JP); Masashi Bando, Tokyo (JP); Yukio Kaneda, Kanagawa (JP); Yoshiyuki Hirano, Kanagawa (JP); Toshiki Moriwaki, Tokyo (JP)

(73) Assignees: Sony Corporation, Tokyo (JP); Sony Semiconductor Solutions Corporation, Tokyo (JP)

( * ) Notice: Subject to any disclaimer, the term of this patent is extended or adjusted under 35 U.S.C. 154(b) by 329 days.

(21) Appl. No.: 17/262,264

(22) PCT Filed: Jul. 30, 2019

(86) PCT No.: PCT/JP2019/029728
§ 371 (c)(1),
(2) Date: Jan. 22, 2021

(87) PCT Pub. No.: WO2020/027081
PCT Pub. Date: Feb. 6, 2020

(65) Prior Publication Data
US 2021/0265428 A1 Aug. 26, 2021

(30) Foreign Application Priority Data
Jul. 30, 2018 (JP) ................. 2018-142497

(51) Int. Cl.
H01L 27/146 (2006.01)
H10K 39/32 (2023.01)
(Continued)

(52) U.S. Cl.
CPC ............. *H10K 39/32* (2023.02); *H10K 19/20* (2023.02); *H10K 30/30* (2023.02); *H10K 30/82* (2023.02); *H01L 27/14647* (2013.01)

(58) Field of Classification Search
CPC ........ H10K 39/32; H10K 19/20; H10K 30/30; H10K 30/82; H01L 27/14647;
(Continued)

(56) References Cited

U.S. PATENT DOCUMENTS

2008/0230123 A1 9/2008 Mitsui et al.
2014/0077324 A1* 3/2014 Matsugai .......... H01L 27/14647
257/432

(Continued)

FOREIGN PATENT DOCUMENTS

JP 2008-227091 9/2008
JP 2010-003902 1/2010
(Continued)

OTHER PUBLICATIONS

International Search Report prepared by the Japan Patent Office dated Oct. 11, 2019, for International Application No. PCT/JP2019/029728.

Primary Examiner — Samuel Park
(74) Attorney, Agent, or Firm — Sheridan Ross PC

(57) ABSTRACT

An imaging element according to an embodiment of the present disclosure includes: a first electrode including a plurality of electrodes; a second electrode opposed to the first electrode; a photoelectric conversion layer including an organic material provided between the first electrode and the second electrode; a first semiconductor layer provided between the first electrode and the photoelectric conversion layer, and including an n-type semiconductor material; and a second semiconductor layer provided between the second electrode and the photoelectric conversion layer, and including at least one of a carbon-containing compound having an
(Continued)

electron affinity larger than a work function of the first electrode or an inorganic compound having a work function larger than the work function of the first electrode.

17 Claims, 25 Drawing Sheets

(51) Int. Cl.
  *H10K 19/20* (2023.01)
  *H10K 30/30* (2023.01)
  *H10K 30/82* (2023.01)
(58) Field of Classification Search
  CPC ......... H01L 27/14621; H01L 27/14625; H01L 27/14636; H01L 27/14641; H01L 27/14612; H01L 31/10; H04N 25/70; Y02E 10/549
  See application file for complete search history.

(56) References Cited

U.S. PATENT DOCUMENTS

| | | | |
|---|---|---|---|
| 2016/0037098 A1* | 2/2016 | Lee | H10K 39/32 |
| | | | 257/292 |
| 2017/0162807 A1* | 6/2017 | Moriwaki | H10K 30/20 |
| 2018/0076252 A1 | 3/2018 | Togashi et al. | |
| 2018/0323390 A1 | 11/2018 | Kaneda | |
| 2019/0067612 A1 | 2/2019 | Tashiro | |

FOREIGN PATENT DOCUMENTS

| | | |
|---|---|---|
| JP | 2010-103457 | 5/2010 |
| JP | 2011-054869 | 3/2011 |
| JP | 2012-138582 | 7/2012 |
| JP | 2014-120616 | 6/2014 |
| JP | 2017-098393 | 6/2017 |
| JP | 2017-143158 | 8/2017 |
| JP | 2017-157816 | 9/2017 |
| TW | 201813073 A | 4/2018 |

* cited by examiner

FIG. 1

IMAGING ELEMENT AND IMAGING APPARATUS

CROSS REFERENCE TO RELATED APPLICATIONS

This application is a national stage application under 35 U.S.C. 371 and claims the benefit of PCT Application No. PCT/JP2019/029728 having an international filing date of 30 Jul. 2019, which designated the United States, which PCT application claimed the benefit of Japanese Patent Application No. 2018-142497 filed 30 Jul. 2018, the entire disclosures of each of which are incorporated herein by reference.

TECHNICAL FIELD

The present disclosure relates to an imaging element using, for example, an organic material, and an imaging apparatus including the same.

BACKGROUND ART

Recently, there has been proposed a so-called longitudinal spectral type imaging element having a longitudinal multilayer configuration in which an organic photoelectric converter is disposed on or above a semiconductor substrate. In the imaging apparatus, light in red and blue wavelength bands is photoelectrically converted by respective photoelectric converters (photodiodes PD1 and PD2) formed in the semiconductor substrate, and light in a green wavelength band is photoelectrically converted by an organic photoelectric conversion film formed on a rear surface side of the semiconductor substrate.

In such an imaging apparatus, electric charges generated by photoelectric conversion in the photodiodes PD1 and PD2 are accumulated at one end in the photodiodes PD1 and PD2, and thereafter transferred to respective floating diffusion layers. This makes it possible to fully deplete the photodiodes PD1 and PD2. Meanwhile, electric charges generated in an organic photoelectric converter are directly accumulated in a floating diffusion layer, which causes difficulty in fully depleting the organic photoelectric converter, thereby resulting in an increase in kTC noise and worsening of random noise. This leads to deterioration in image quality in imaging.

In contrast, for example, PTL 1 discloses an imaging element in which a photoelectric converter provided on a semiconductor substrate and including a first electrode, a photoelectric conversion layer, and a second electrode that are stacked, an electrode for electric charge accumulation that is disposed separately from the first electrode and is opposed to the photoelectric conversion layer with an insulating layer interposed therebetween is provided to thereby suppress deterioration in image quality in imaging.

CITATION LIST

Patent Literature

PTL 1: Japanese Unexamined Patent Application Publication No. 2017-157816

SUMMARY OF THE INVENTION

Incidentally, in an imaging apparatus, a further improvement in image quality in imaging is desired.

It is desirable to provide an imaging element and an imaging apparatus that make it possible to improve image quality in imaging.

An imaging element according to an embodiment of the present disclosure includes: a first electrode including a plurality of electrodes; a second electrode opposed to the first electrode; a photoelectric conversion layer including an organic material provided between the first electrode and the second electrode; a first semiconductor layer provided between the first electrode and the photoelectric conversion layer, and including an n-type semiconductor material; and a second semiconductor layer provided between the second electrode and the photoelectric conversion layer, and including at least one of a carbon-containing compound having an electron affinity larger than a work function of the first electrode or an inorganic compound having a work function larger than the work function of the first electrode.

An imaging apparatus according to an embodiment of the present disclosure includes, for each of a plurality of pixels, one or a plurality of imaging elements according to the above-described embodiment of the present disclosure.

In the imaging element according to the embodiment of the present disclosure and the imaging apparatus according to the embodiment of the present disclosure, in the imaging element in which the first electrode including the plurality of electrodes, the first semiconductor layer including the n-type semiconductor material, the photoelectric conversion layer, and the second electrode are stacked in this order, the second semiconductor layer is provided between the photoelectric conversion layer and the second electrode. The second semiconductor layer is formed including at least one of the carbon-containing compound having an electron affinity larger than the work function of the first electrode, or the inorganic compound having a work function larger than the work function of the first electrode. Accordingly, electric charges generated in the photoelectric conversion layer are rapidly transferred to the first semiconductor layer.

According to the imaging element according to the embodiment of the present disclosure and the imaging apparatus according to the embodiment of the present disclosure, the second semiconductor layer including at least one of the carbon-containing compound having an electron affinity larger than the work function of the first electrode, or the inorganic compound having a work function larger than the work function of the first electrode is provided between the second electrode and the photoelectric conversion layer; therefore, electric charges generated in the photoelectric conversion layer are rapidly transferred to the first semiconductor layer. This makes it possible to improve image quality in imaging.

It is to be noted that effects described here are not necessarily limited and any of effects described in the present disclosure may be included.

BRIEF DESCRIPTION OF DRAWINGS

FIG. 1 is a cross-sectional view of an example of a schematic configuration of an imaging element according to an embodiment of the present disclosure.

FIG. 17 is a block diagram illustrating a configuration of an imaging apparatus using, as a pixel, the imaging element illustrated in FIG. 1 or the like.

MODES FOR CARRYING OUT THE INVENTION

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, and the like of respective components illustrated in the respective drawings. It is to be noted that description is given in the following order.

Figure 1:
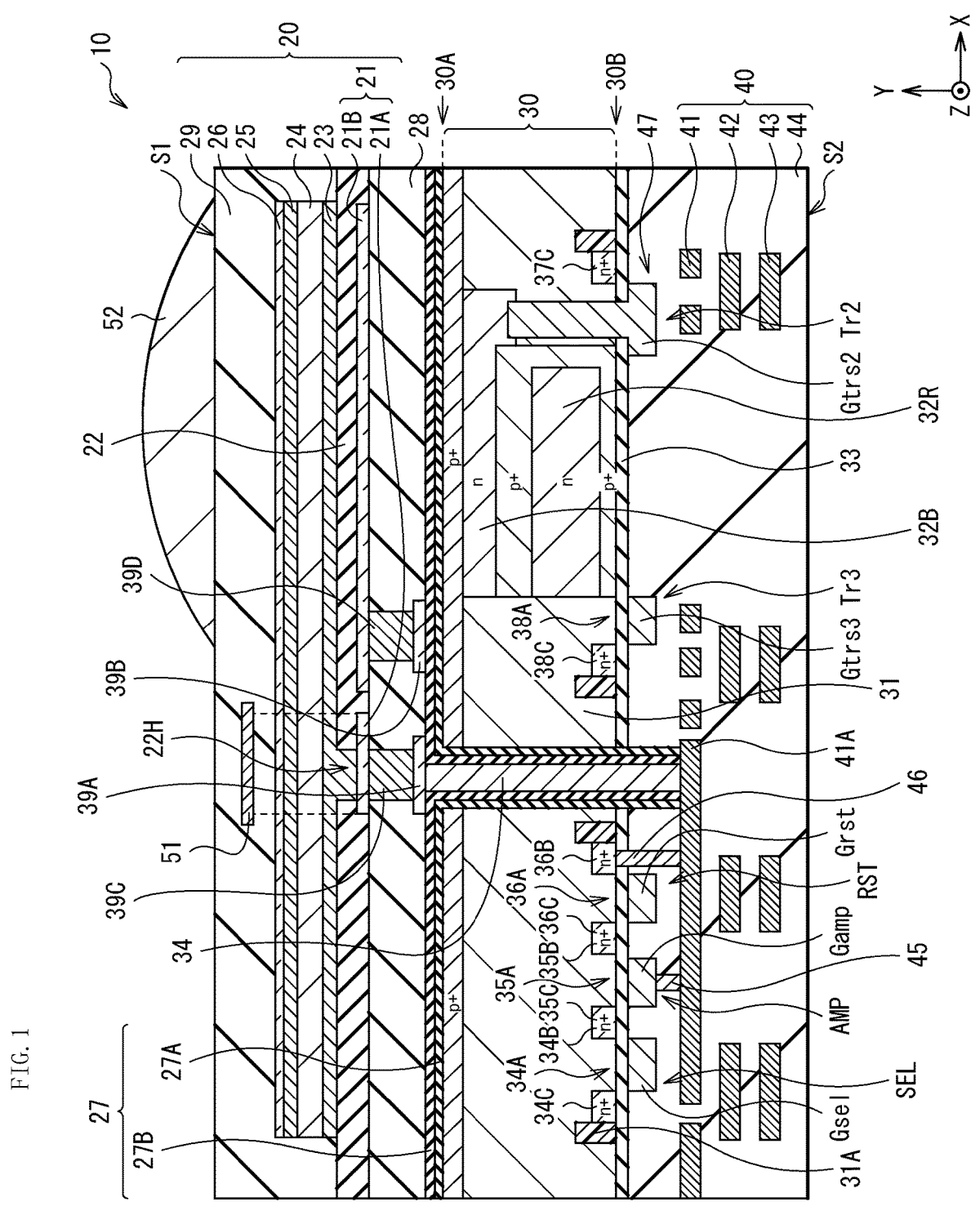
Figure 2:
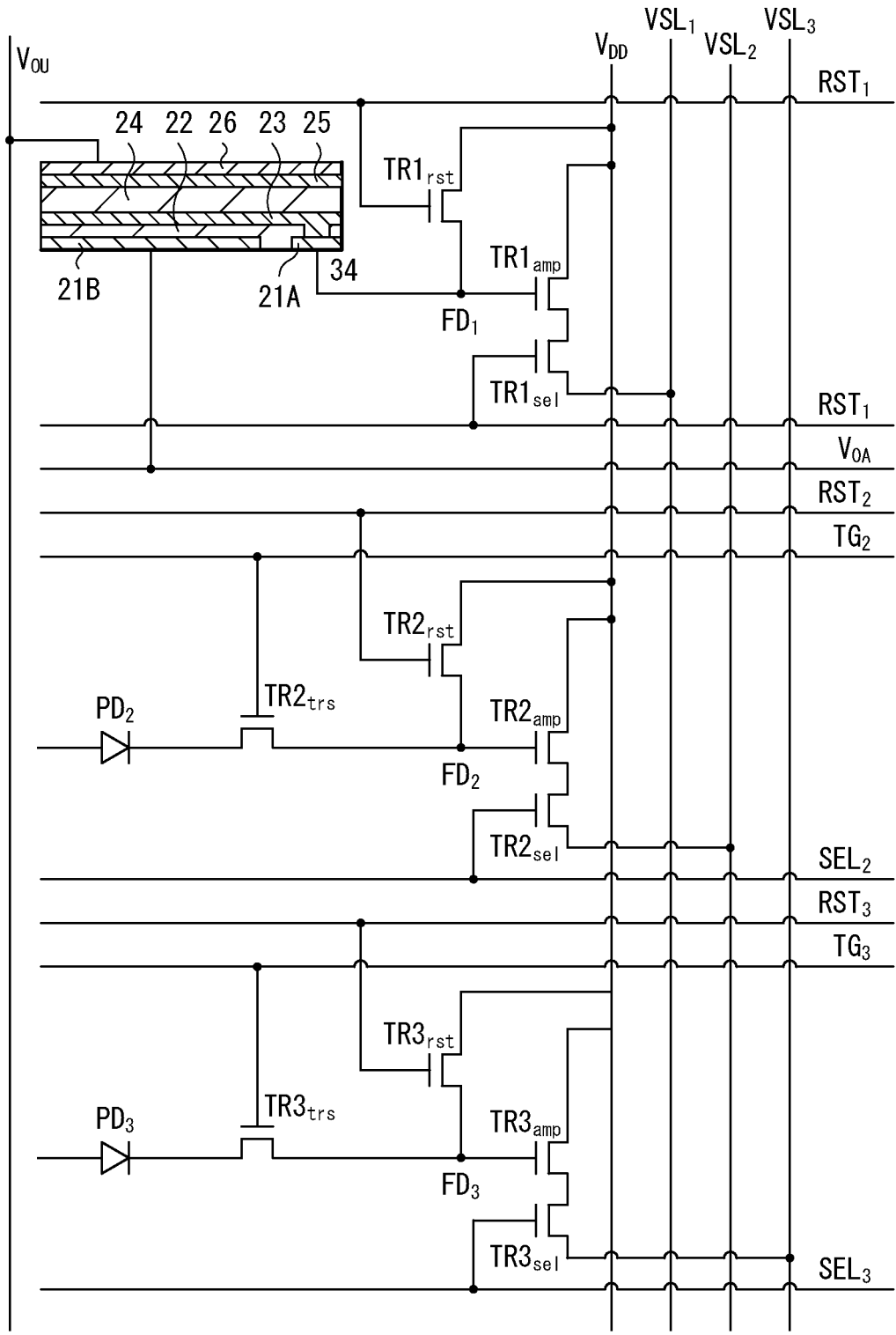
FIG. 2 is an equivalent circuit diagram of the imaging element illustrated in FIG. 1.
Figure 3:
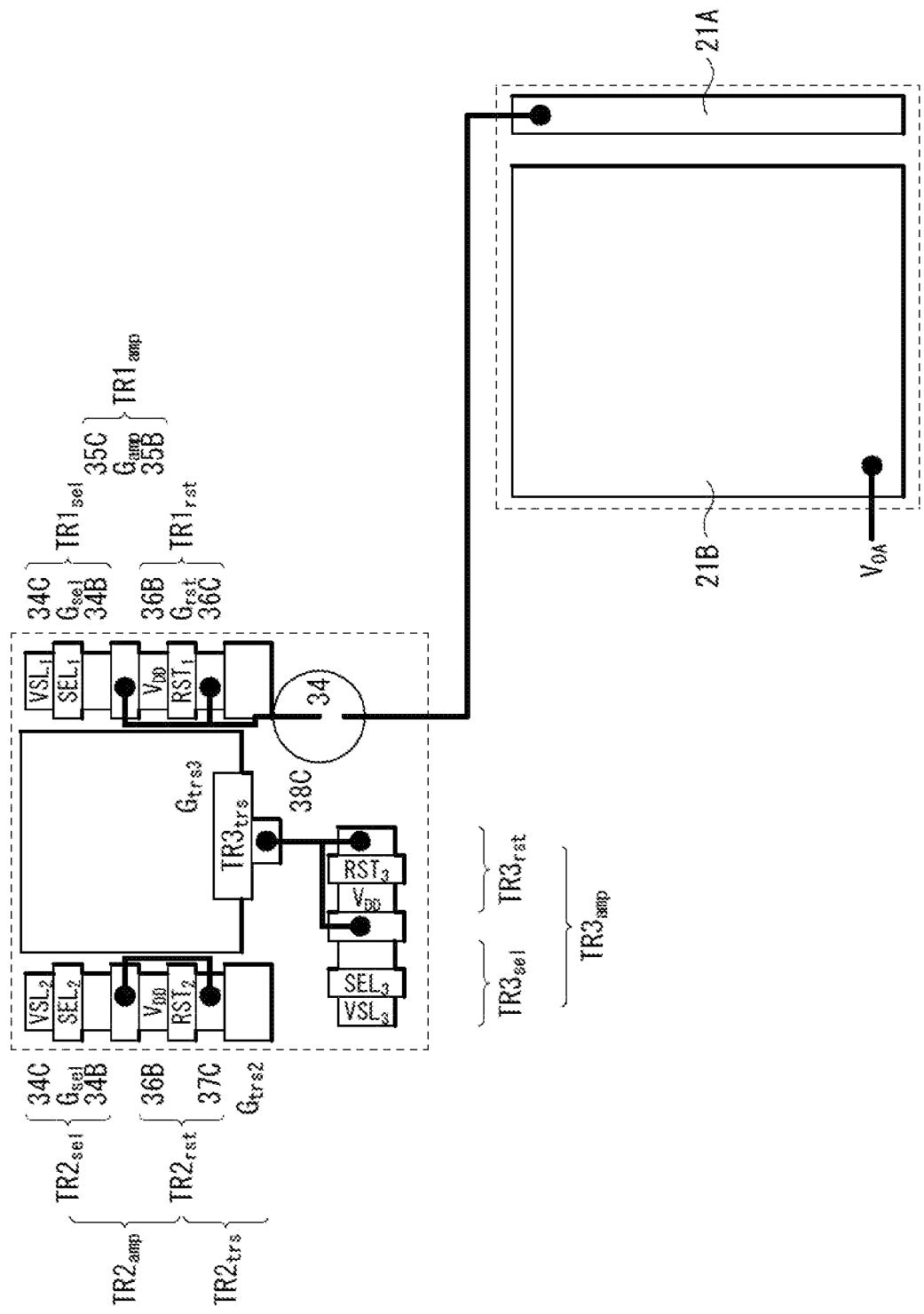
FIG. 3 is a schematic view of arrangement of a low electrode and transistors included in a controller in the imaging element illustrated in FIG. 1.

1. Embodiment (an example in which a work function adjustment layer having a predetermined work function or electron affinity is provided between a photoelectric conversion layer and an upper electrode)
  1-1. Configuration of Imaging Element
  1-2. Method of Manufacturing Imaging Element
  1-3. Workings and Effects
2. Modification Examples
  2-1. Modification Example 1 (an example in which a plurality of electrodes is included on an upper electrode side)
  2-2. Modification Example 2 (an example in which a work function adjustment layer is formed using a composite oxide)
  2-3. Modification Example 3 (an example in which an exciton blocking layer is further provided between a photoelectric conversion layer and a work function adjustment or the like)
3. Application Examples
4. Practical Application Examples
5. Working Examples 1. Embodiment FIG. 1 illustrates a cross-sectional configuration of an imaging element (an imaging element 10) according to an embodiment of the present disclosure. FIG. 2 is an equivalent circuit diagram of the imaging element 10 illustrated in FIG. 1. FIG. 3 schematically illustrates arrangement of a lower electrode 21 and transistors included in a controller. The imaging element 10 is included in one pixel (unit pixel P) of an imaging apparatus (an imaging apparatus 1; refer to FIG. 17) such as a CMOS (Complementary Metal Oxide Semiconductor) image sensor used for an electronic apparatus such as a digital still camera and a video camera, for example. The imaging element 10 according to the present embodiment includes a work function adjustment layer 25 (a second semiconductor layer) having a predetermined work function or electron affinity between a photoelectric conversion layer 24 and an upper electrode 26 (a second electrode) in an organic photoelectric converter 20 provided on a semiconductor substrate 30.

1-1. Configuration of Imaging Element

The imaging element 10 is of a so-called longitudinal spectral type in which one organic photoelectric converter 20 and two inorganic photoelectric converters 32B and 32R are stacked in a longitudinal direction. The organic photoelectric converter 20 is provided on a first surface (a rear surface) 30A side of the semiconductor substrate 30. The inorganic photoelectric converters 32B and 32R are formed to be embedded in the semiconductor substrate 30, and are stacked in a thickness direction of the semiconductor substrate 30. The organic photoelectric converter 20 includes the photoelectric conversion layer 24 formed using an organic material between the lower electrode 21 (a first electrode) and the upper electrode 26 that are opposed to each other. The photoelectric conversion layer 24 includes a p-type semiconductor and an n-type semiconductor, and has a bulk heterojunction structure in a layer. The bulk heterojunction structure is a p-n junction surface formed by mixing the p-type semiconductor and the n-type semiconductor.

In the organic photoelectric converter 20 according to the present embodiment, the lower electrode 21 includes a plurality of electrodes (a readout electrode 21A and an accumulation electrode 21B) for each pixel, and includes an insulating layer 22 and an electric charge accumulation layer 23 (a first semiconductor layer) including an n-type semiconductor material in order between the lower electrode 21 and the photoelectric conversion layer 24. The insulating layer 22 has an opening 22H above the readout electrode 21A, and the readout electrode 21A is electrically coupled to the electric charge accumulation layer 23 via the opening 22H. Furthermore, in the present embodiment, the work function adjustment layer 25 having a predetermined work function or electron affinity is provided between the photoelectric conversion layer 24 and the upper electrode 26.

The organic photoelectric converter 20 and the inorganic photoelectric converters 32B and 321R each selectively detect light in a corresponding one of wavelength regions different from each other, and perform photoelectric conversion of the thus-detected light. Specifically, the organic photoelectric converter 20 acquires a green (G) color signal. The inorganic photoelectric converters 32B and 32R respectively acquire a blue (B) color signal and a red (R) color signal by a difference in absorption coefficient. This allows the imaging element 10 to acquire a plurality of color signals in one pixel without using a color filter.

It is to be noted that, in the present embodiment, description is given of a case where electrons of pairs of electrons and holes (electron-hole pairs) generated by photoelectric conversion are read as signal electric charges (a case where an n-type semiconductor region serves as a photoelectric conversion layer). Moreover, in the drawings, "+(plus)" attached to "p" or "n" indicates that p-type or n-type impurity concentration is high.

For example, floating diffusions (floating diffusion layers) FD1 (a region 36B in the semiconductor substrate 30), FD2 (a region 37C in the semiconductor substrate 30), and FD3 (a region 38C in the semiconductor substrate 30), transfer transistors Tr1 and Tr2, an amplifier transistor (a modulation element) AMP, a reset transistor RST, a selection transistor SEL, and a multilayer wiring layer 40 are provided on a second surface (a front surface) 30B of the semiconductor substrate 30. The multilayer wiring layer 40 has, for example, a configuration in which wiring layers 41, 42, and 43 are stacked in an insulating layer 44.

It is to be noted that in the drawings, the first surface 30A side of the semiconductor substrate 30 is represented as a light incident side S1 and the second surface 30B side of the semiconductor substrate 30 is represented as a wiring layer side S2.

The organic photoelectric converter 20 has a configuration in which the lower electrode 21, the electric charge accumulation layer 23, the photoelectric conversion layer 24, the work function adjustment layer 25, and the upper electrode 26 are stacked in this order from the first surface 30A side of the semiconductor substrate 30, as described above. In addition, the insulating layer 22 is provided between the lower electrode 21 and the electric charge accumulation layer 23. The lower electrode 21 is formed separately for each imaging element 10, for example, and includes the readout electrode 21A and the accumulation electrode 21B that are separated from each other with the insulating layer 22 interposed therebetween, as described in detail later. Of the lower electrode 21, the readout electrode 21A is electrically coupled to the photoelectric conversion layer 24 via the opening 22H provided in the insulating layer 22. FIG. 1 illustrates an example in which the electric charge accumulation layer 23, the photoelectric conversion layer 24, the work function adjustment layer 25, and the upper electrode 26 are formed separately for each imaging element 10, but may each be provided as a continuous layer common to a plurality of imaging elements 10. For example, an insulating layer 27 and an interlayer insulating layer 28 are provided between the first surface 30A of the semiconductor substrate 30 and the lower electrode 21. The insulating layer 27 includes a layer having fixed electric charges (a fixed electric charge layer) 27A, and a dielectric layer 27B having an insulation property. A protective layer 29 is provided on the upper electrode 26. A light-shielding film 51 is provided, for example, at a position corresponding to the readout electrode 21 in the protective layer 29. It is sufficient if the light-shielding film 51A is provided to cover at least a region of the readout electrode 21A in direct contact with the photoelectric conversion layer 24 without covering at least the accumulation electrode 21B. A planarization layer (not illustrated) and an optical member such as an on-chip lens layer 52 are provided above the protective layer 29.

A through electrode 34 is provided between the first surface 30A and the second surface 30B of the semiconductor substrate 30. The organic photoelectric converter 20 is coupled to a gate Gamp of the amplifier transistor AMP and one source-drain region 36B of a reset transistor RST (a reset transistor Tr1rst) also serving as the floating diffusion FD1 via the through electrode 34. This allows the imaging element 10 to well transfer electric charges (herein, electrons) generated in the organic photoelectric converter 20 on the first surface 30A side of the semiconductor substrate 30 to the second surface 30B side of the semiconductor substrate 30 via the through electrode 34, thereby improving characteristics.

A lower end of the through electrode 34 is coupled to a coupling section 41A in the wiring layer 41, and the coupling section 41 and the gate Gamp of the amplifier transistor AMP are coupled to each other via a first lower contact 45. The coupling section 41A and the floating diffusion FD1 (the region 36B) are coupled to each other via a second lower contact 46, for example. An upper end of the through electrode 34 is coupled to the readout electrode 21A via a pad section 39A and a first upper contact 39C, for example.

The through electrode 34 is provided for each organic photoelectric converter 20 in each of the imaging elements 10, for example. The through electrode 34 has a function as a connector between the organic photoelectric converter 20 and both the gate Gamp of the amplifier transistor AMP and the floating diffusion FD1, and serves as a transmission path of electric charges (herein, electrons) generated in the organic photoelectric converter 20.

A reset gate Grst of the reset transistor RST is disposed adjacent to the floating diffusion FD1 (one source/drain regions 36B of the reset transistor RST). This makes it possible to reset electric charges accumulated in the floating diffusion FD1 by the reset transistor RST.

In the imaging element 10 according to the present embodiment, light having entered the organic photoelectric converter 20 from the upper electrode 26 side is absorbed by the photoelectric conversion layer 24. Excitons thereby generated move to an interface between an electron donor and an electron acceptor included in the photoelectric conversion layer 24, and the excitons are dissociated, that is, the excitons are dissociated into electrons and holes. Electric charges generated herein (electrons and holes) are carried to respective different electrodes by diffusion resulting from a difference in concentration between carriers or an internal electric field resulting from a difference in work function between an anode (herein, the upper electrode 26) and a cathode (herein, the lower electrode 21), and detected as a photocurrent. Moreover, it is also possible to control transport directions of the electrons and the holes by application of a potential between the lower electrode 21 and the upper electrode 26.

In the following, description is given of the configurations, materials, and the like of respective components.

The organic photoelectric converter 20 is an organic photoelectric conversion element that absorbs green light corresponding to a wavelength region of a portion or the entirety of a selective wavelength region (for example, from 450 nm to 650 nm both inclusive) to generate electron-hole pairs.

The lower electrode 21 includes the readout electrode 21A and the accumulation electrode 21B that are separately formed, as described above. The readout electrode 21A transfers, to the floating diffusion FD1, electric charges (herein, electrons) generated in the photoelectric conversion layer 24, and is coupled to the floating diffusion FD1 via the first upper contact 39C, the pad section 39A, the through electrode 34, the coupling section 41A, and the second lower contact 46, for example. The accumulation electrode 21B accumulates, in the electric charge accumulation layer 23, electrons as signal electric charges of the electric charges generated in the photoelectric conversion layer 24. The accumulation electrode 21B is directly opposed to light reception surfaces of the inorganic photoelectric converters 32B and 32R formed in the semiconductor substrate 30, and is provided in a region covering these light reception surfaces. The accumulation electrode 21B is preferably larger than the readout electrode 21A, which makes it possible to accumulate a large number of electric charges.

The lower electrode 21 includes an electrically conductive film having light transmissivity, and includes, for example, ITO (indium tin oxide). However, in addition to ITO, a tin oxide ($SnO_2$)-based material doped with a dopant, or a zinc oxide-based material prepared by doping zinc oxide (ZnO) with a dopant may be used as a material of the lower electrode 21. Examples of the zinc oxide-based material include aluminum zinc oxide (AZO) doped with aluminum (Al) as a dopant, gallium zinc oxide (GZO) doped with gallium (Ga), and indium zinc oxide (IZO) doped with indium (In). In addition to these materials, CuI, $InSbO_4$, ZnMgO, $CuInO_2$, $MgIN_2O_4$, CdO, $ZnSnO_3$ or the like may be used.

The electric charge accumulation layer 23 is provided below the photoelectric conversion layer 24, specifically between the insulating layer 22 and the photoelectric conversion layer 24, and accumulates signal electric charges (herein, electrons) generated in the photoelectric conversion layer 24. The electric charge accumulation layer 23 corresponds to a specific example of a "first semiconductor layer" of the present disclosure. In the present embodiment, electrons are used as signal electric charges; therefore, the electric charge accumulation layer 23 is preferably formed using an n-type semiconductor material, and preferably uses, for example, a material having, at a bottom of a conduction band, an energy level shallower than a work function of the lower electrode 21. Examples of such a n-type semiconductor material include IGZO (an In—Ga—Zn—O-based oxide semiconductor), ZTO (a Zn—Sn—O-based oxide semiconductor), IGZTO (an In—Ga—Zn—Sn—O-based oxide semiconductor), GTO (a Ga—Sn—O-based oxide semiconductor), IGO (an In—Ga—O-based oxide semiconductor), and the like. The electric charge accumulation layer 23 preferably uses at least one kind of the oxide semiconductor materials described above, and IGZO, in particular is suitably used. The electric charge accumulation layer 23 has, for example, a thickness of 30 nm to 200 nm both inclusive, and preferably has a thickness of 60 nm to 150 nm both inclusive. Providing the electric charge accumulation layer 23 including the above-described material below the photoelectric conversion layer 24 makes it possible to prevent recombination of electric charges during electric charge accumulation and improve transfer efficiency.

The photoelectric conversion layer 24 converts optical energy into electric energy. The photoelectric conversion layer 24 includes, for example, two or more kinds of organic materials (p-type semiconductor materials or n-type semiconductor materials) that each function as a p-type semiconductor or an n-type semiconductor. The photoelectric conversion layer 24 has a junction surface (a p-n junction surface) of the p-type semiconductor material and the n-type semiconductor material in a layer. The p-type semiconductor relatively functions as an electron donor (a donor), and the n-type semiconductor relatively functions as an electron acceptor (an acceptor). The photoelectric conversion layer 24 provides a field where excitons generated upon absorption of light are dissociated into electrons and holes. Specifically, the excitons are dissociated into the electrons and the holes at an interface (the p-n junction surface) between the electron donor and the electron acceptor.

The photoelectric conversion layer 24 may include, in addition to the p-type semiconductor material and the n-type semiconductor material, an organic material, i.e., a so-called dye material, that photoelectrically converts light in a predetermined wavelength region and allows light in another wavelength region to pass therethrough. In a case where the photoelectric conversion layer 24 is formed using three kinds of organic materials, that is, the p-type semiconductor material, the n-type semiconductor material, and the dye material, the p-type semiconductor material and the n-type semiconductor material are preferably materials having light transmissivity in a visible region (for example, from 450 nm to 800 nm). The photoelectric conversion layer 24 has a thickness of 50 nm to 500 nm, for example.

The photoelectric conversion layer 24 according to the present embodiment preferably includes an organic material and has absorption of light from visible light to near-infrared light. Examples of the organic material included in the photoelectric conversion layer 24 include quinacridone, boron subphthalocyanine chloride, pentacene, benzothieno-benzothiophene, fullerene, and derivatives thereof. The photoelectric conversion layer 24 includes two or more kinds of the above-described organic materials. The combination of the organic materials described above function as a p-type semiconductor or an n-type semiconductor depending on the combination.

It is to be noted that the organic materials included in the photoelectric conversion layer 24 are not specifically limited. In addition to the organic materials described above, for example, one kind of naphthalene, anthracene, phenanthrene, tetracene, pyrene, perylene, fluoranthene, and derivatives thereof is preferably used. Alternatively, a polymer such as phenylenevinylene, fluorene, carbazole, indole, pyrrole, picoline, thiophene, acetylene, diacetylene or a derivative thereof may be used. Additionally, it is possible to preferably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and a croconic methine group as a bonded chain, or by a squarylium group or a croconic methine group, or the like. It is to be noted that as the above-described metal complex dye, a dithiol metal complex-based dye, a metallophthalocyanine dye, a metalloporphyrine dye, or a ruthenium complex dye is preferable, but the metal complex dye is not limited thereto.

The work function adjustment layer 25 is provided above the photoelectric conversion layer 24, specifically between the photoelectric conversion layer 24 and the upper electrode 26, and changes an internal electric field in the photoelectric conversion layer 24 to rapidly transfer and accumulate, into the electric charge accumulation layer 23, signal electric charges generated in the photoelectric conversion layer 24. The work function adjustment layer 25 has light transmissivity, and preferably has a light absorptance of 10% or less for visible light, for example. In addition, it is possible to form the work function adjustment layer 25 using a carbon-containing compound having an electron affinity larger than the work function of the electric charge accumulation layer 23. Examples of such a material include a tetracyanoquinodimethane derivative such as 2,3,5,6-tetrafluoro-tetracyanoquinodimethane (F4-TCNQ), 2,3,5-trifluoro-tetracyanoquinodimethane (F3-TCNQ), 2,5-difluoro-tetracyanoquinodimethane (F2-TCNQ), 2-fluoro-tetracyanoquinodimethane (F1-TCNQ), 2-trifluoromethyl-tetracyanoquinodimethane (CF3-TCNQ), and 1,3,4,5,7,8-hexafluoro-tetracyanonaphthoquinodimethane (F6-TCNQ), a hexaazatriphenylene derivative such as 1,4,5,8,9,12-hexaazatriphenylene-2,3,6,7,10,11-hexacarbonitrile (HATCN), a hexaazatrinaphthylene derivative such as 2,3,8,9,14,15-hexachloro-5,6,11,12,17,18-hexaazatrinaphthylene (HATNA-C16) and 2,3,8,9,14,15-hexafluoro-5,6,11,12,17,18-hexaazatrinaphthylene (HATNA-F6), a phthalocyanine derivative such as 1,2,3,4,8,9,10,11,15,16,17,18,22,23,24,25-hexadecafluoro-copper phthalocyanine (F16-CuPc), fluorinated fullerene such as C60F36 and C60F48, and the like. Alternatively, it is possible to form the work function adjustment layer 25 using an inorganic compound having a work function larger than the work function of the lower electrode 21 (specifically, the accumulation electrode 21). Examples of such a material include a transition metal oxide having a single composition such as molybdenum oxide ($MoO_3$), tungsten oxide ($WO_3$), vanadium oxide ($V_2O_5$), and rhenium oxide ($ReO_3$), salts such as copper iodide (CuI), antimony chloride ($SbCl_5$), iron oxide ($FeCl_3$), and sodium chloride (NaCl), and the like. The work function adjustment layer 25 may be formed as a single-layer film singly using the carbon-containing compound or the inorganic compound described above, or may be formed as a stacked film of a layer including a carbon compound and a layer including an inorganic compound. In this case, it is preferable to stack the layers in order of a carbon-containing compound film and an inorganic compound film in consideration of damage caused by annealing treatment in film formation of the upper electrode 26. The work function adjustment layer 25 has a thickness of 0.5 nm to 30 nm, for example.

Any other layer may be provided between the photoelectric conversion layer 24 and the lower electrode 21 (for example, between the electric charge accumulation layer 23 and the photoelectric conversion layer 24) and between the photoelectric conversion layer 24 and the upper electrode 26 (for example, between the photoelectric conversion layer 24 and the work function adjustment layer 25). Specifically, for example, the electric charge accumulation layer 23, an electron blocking film, the photoelectric conversion layer 24, a hole blocking film, the work function adjustment layer 25, and the like are stacked in order from the lower electrode 21 side. Further, a undercoat layer and a hole transport layer may be provided between the lower electrode 21 and the photoelectric conversion layer 24, and a buffer layer or an electron transport layer may be provided between the photoelectric conversion layer 24 and the upper electrode 26. The buffer layer or the electron transport layer provided between the photoelectric conversion layer 24 and the upper electrode 26 preferably has an energy level shallower than the work function of the work function adjustment layer 25. In addition, the buffer layer or the electron transport layer provided between the photoelectric conversion layer 24 and the upper electrode 26 are preferably formed using an organic material having a glass transition point higher than 100° C., for example.

The upper electrode 26 includes an electrically conductive film having light transmissivity similarly to the lower electrode 21. In the imaging apparatus 1 using the imaging element 10 as one pixel, the upper electrode 26 may be separately provided for each of the pixels, or may be formed as a common electrode for the respective pixels. The upper electrode 26 has, for example, a work function smaller than the work function of the work function adjustment layer 25. The upper electrode 26 has a thickness of 10 nm to 200 nm, for example.

The fixed electric charge layer 27A may include a film having positive fixed electric charges or a film having negative fixed electric charges. Examples of a material of the film having the negative fixed electric charges include hafnium oxide, aluminum oxide, zirconium oxide, tantalum oxide, titanium oxide, and the like. In addition, as a material other than the above-described materials, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, an aluminum oxynitride film, or the like may also be used.

The fixed electric charge layer 27A may have a configuration in which two or more kinds of films are stacked. This makes it possible to further enhance a function as a hole accumulation layer, for example, in the case of the film having the negative fixed electric charges.

Although a material of the dielectric layer 27B is not specifically limited, the dielectric layer 27B is formed using, for example, a silicon oxide film, TEOS, a silicon nitride film, a silicon oxynitride film, or the like.

The interlayer insulation layer 28 includes, for example, a single-layer film including one kind of silicon oxide, silicon nitride, silicon oxynitride (SiON), and the like, or a stacked film including two or more kinds thereof.

The insulating layer 22 electrically separates the accumulation electrode 21B and the electric charge accumulation layer 23 from each other. The insulating layer 22 is provided on the interlayer insulating layer 28 to cover the lower electrode 21, for example. In addition, the insulating layer 22 has the opening 22H above the readout electrode 21A of the lower electrode 21, and the readout electrode 21A and the electric charge accumulation layer 23 are electrically coupled to each other via the opening 22H. It is possible to form the insulating layer 22 using a material similar to that of the interlayer insulating layer 28, for example, and the insulating layer 22 includes, for example, a single-layer film including one kind of silicon oxide, silicon nitride, silicon oxynitride (SiON), and the like, or a stacked film including two or more kinds thereof. The insulating layer 22 has a thickness of 20 nm to 500 nm, for example.

The protective layer 29 includes a material having light transmissivity, and includes, for example, a single-layer film including one of silicon oxide, silicon nitride, silicon oxynitride, and the like, or a stacked film including two or more kinds thereof. The protective layer 29 has a thickness of 100 nm to 30000 nm, for example.

The semiconductor substrate 30 includes a n-type silicon (Si) substrate, for example, and has a p-well 31 in a predetermined region. The transfer transistors Tr2 and Tr3, the amplifier transistor AMP, the reset transistor RST, the selection transistor SEL, and the like described above are provided on the second surface 30B of the p-well 31. In addition, a peripheral circuit (not illustrated) including a logic circuit, and the like is provided in a periphery of the semiconductor substrate 30.

The reset transistor RST (the rest transistor Tr1rst) resets electric charges transferred from the organic photoelectric converter 20 to the floating diffusion FD1, and includes a MOS transistor, for example. Specifically, the reset transistor Tr1rst includes a reset gate Grst, a channel formation region 36A, and source-drain regions 36B and 36C. The reset gate Grst is coupled to a reset line RST1, and one source-drain region 36B of the reset transistor Tr1rst also serves as the floating diffusion FD1. The other source-drain region 36C included in the reset transistor Tr1rst is coupled to a power source VDD.

The amplifier transistor AMP is a modulation element that modulates an amount of electric charges generated in the organic photoelectric converter 20 into voltage, and includes a MOS transistor, for example. Specifically, the amplifier transistor AMP includes agate Gamp, a channel formation region 35A, and source-drain regions 35B and 35C. The gate Gamp is coupled to the readout electrode 21A and the one source-drain region 36B (the floating diffusion FD1) of the reset transistor Tr1rst via the first lower contact 45, the coupling section 41A, the second lower contact 46, the through electrode 34, and the like. In addition, one source-drain region 35B shares a region with the other source-drain region 36C included in the reset transistor Tr1rst, and is coupled to the power source VDD.

The selection transistor SEL (a selection transistor TR1sel) includes a gate Gsel, a channel formation region 34A, and source-drain regions 34B and 34C. The gate Gsel is coupled to a selection line SEL1. In addition, one source-drain region 34B shares a region with the other source-drain region 35C included in the amplifier transistor AMP, and the other source-drain region 34C is coupled to a signal line (a data output line) VSL1.

The inorganic photoelectric converters 32B and 32R each have a p-n junction in a predetermined region of the semiconductor substrate 30. The inorganic photoelectric converters 32B and 32R enable dispersion of light in a longitudinal direction with use of a difference in wavelength of absorbed light depending on a depth of light incidence in the silicon substrate. The inorganic photoelectric converter 32B selectively detects blue light to accumulate signal electric charges corresponding to blue, and is disposed at a depth that allows for efficient photoelectric conversion of blue light. The inorganic photoelectric converter 32R selectively detects red light to accumulate signal electric charges corresponding to red, and is disposed at a depth that allows for efficient photoelectric conversion of red light. It is to be noted that blue (B) and red (R) are colors respectively corresponding to a wavelength region from 450 nm to 495 nm, for example, and a wavelength region from 620 nm to 750 nm, for example. It is sufficient if each of the inorganic photoelectric converters 32B and 32R is allowed to detect light in a portion or the entirety of a corresponding one of the wavelength regions.

The inorganic photoelectric converter 32B includes a p+ region serving as a hole accumulation layer, and an n region serving as an electron accumulation layer, for example. The inorganic photoelectric converter 32R has a p+ region serving as a hole accumulation layer, and an n region serving as an electron accumulation layer (has a stacking structure of p-n-p), for example. The n region of the inorganic photoelectric converter 32B is coupled to the vertical type transfer transistor Tr2. The p+ region of the inorganic photoelectric converter 32B bends along the transfer transistor Tr2 and is coupled to the p+ region of the inorganic photoelectric converter 32R.

The transfer transistor Tr2 (a transfer transistor TR2trs) transfers, to the floating diffusion FD2, signal electric charges (herein, electrons) corresponding to blue generated and accumulated in the inorganic photoelectric converter 32B. The inorganic photoelectric converter 32B is formed at a position deep from the second surface 30B of the semiconductor substrate 30; therefore, the transfer transistor TR2trs of the inorganic photoelectric converter 32B preferably includes a vertical type transistor. In addition, the transfer transistor TR2trs is coupled to a transfer gate line TG2. Furthermore, the floating diffusion FD2 is provided in a region 37C in proximity to a gate Gtrs2 of the transfer transistor TR2trs. The electric charges accumulated in the inorganic photoelectric converter 32B are read by the floating diffusion FD2 through a transfer channel formed along the gate Gtrs2.

The transfer transistor Tr3 (a transfer transistor TR3trs) transfers, to the floating diffusion FD3, signal electric charges (herein, electrons) corresponding to red generated and accumulated in the inorganic photoelectric converter 32R, and includes, for example, a MOS transistor. In addition, the transfer transistor TR3trs is coupled to a transfer gate line TG3. Furthermore, the floating diffusion FD3 is provided in a region 38C in proximity to a gate Gtrs3 of the transfer transistor TR3trs. The electric charges accumulated in the inorganic photoelectric converter 32R are read by the floating diffusion FD3 through a transfer channel formed along the gate Gtrs3.

A reset transistor TR2rst, an amplifier transistor TR2amp, and a selection transistor TR2sel that are included in a controller of the inorganic photoelectric converter 32B are further provided on the second surface 30B side of the semiconductor substrate 30. In addition, a reset transistor TR3rst, an amplifier transistor TR3amp, and a selection transistor TR3sel that are included in a controller of the inorganic photoelectric converter 32R are further provided.

The reset transistor TR2rst includes a gate, a channel formation region, and source-drain regions. The gate of the reset transistor TR2rst is coupled to a reset line RST2, and one of the source-drain regions of the reset transistor TR2rst is coupled to the power source VDD. Another source-drain region of the reset transistor TR2rst also serves as the floating diffusion FD2.

The amplifier transistor TR2amp includes a gate, a channel formation region, and source-drain regions. The gate is coupled to the other source-drain region (the floating diffusion FD2) of the reset transistor TR2rst. In addition, one source-drain region included in the amplifier transistor TR2amp shares a region with the one source-drain region included in the reset transistor TR2rst, and is coupled to the power source VDD.

The selection transistor TR2sel includes agate, a channel formation region, and source-drain regions. The gate is coupled to a selection line SEL2. In addition, one of the source-drain regions included in the selection transistor TR2sel shares a region with another source-drain region included in the amplifier transistor TR2amp. Another source-drain region included in the selection transistor TR2sel is coupled to a signal line (a data output line) VSL2.

The reset transistor TR3rst includes a gate, a channel formation region, and source-drain regions. The gate of the reset transistor TR3rst is coupled to a reset line RST3, and one of the source-drain regions included in the reset transistor TR3rst is coupled to the power source VDD. Another source-drain region included in the reset transistor TR3rst also serves as the floating diffusion FD3.

The amplifier transistor TR3amp includes a gate, a channel formation region, and source-drain regions. The gate is coupled to the other source-drain region (the floating diffusion FD3) included in the reset transistor TR3rst. In addition, one of the source-drain regions included in the amplifier transistor TR3amp shares a region with the one source-drain region included in the reset transistor TR3rst, and is coupled to the power source VDD.

The selection transistor TR3sel includes agate, a channel formation region, and source-drain regions. The gate is coupled to a selection line SEL3. In addition, one of the source-drain regions included in the selection transistor TR3sel shares a region with another source-drain region included in the amplifier transistor TR3amp. Another source-drain region included in the selection transistor TR3sel is coupled to a signal line (a data output line) VSL3.

Each of the reset lines RST1, RST2, and RST3, the selection lines SEL1, SEL2, and SEL3, the transfer gate lines TG2 and TG3 is coupled to a vertical drive circuit 112 included in a drive circuit. The signal lines (data output lines) VSL1, VSL2, and VSL3 are coupled to a column signal processing circuit 113 included in the drive circuit.

The first lower contact 45, the second lower contact 46, the first upper contact 39C, and the second upper contact 39D each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

1-2. Method of Manufacturing Imaging Element

It is possible to manufacture the imaging element 10 according to the present embodiment as follows, for example.

Figure 4:
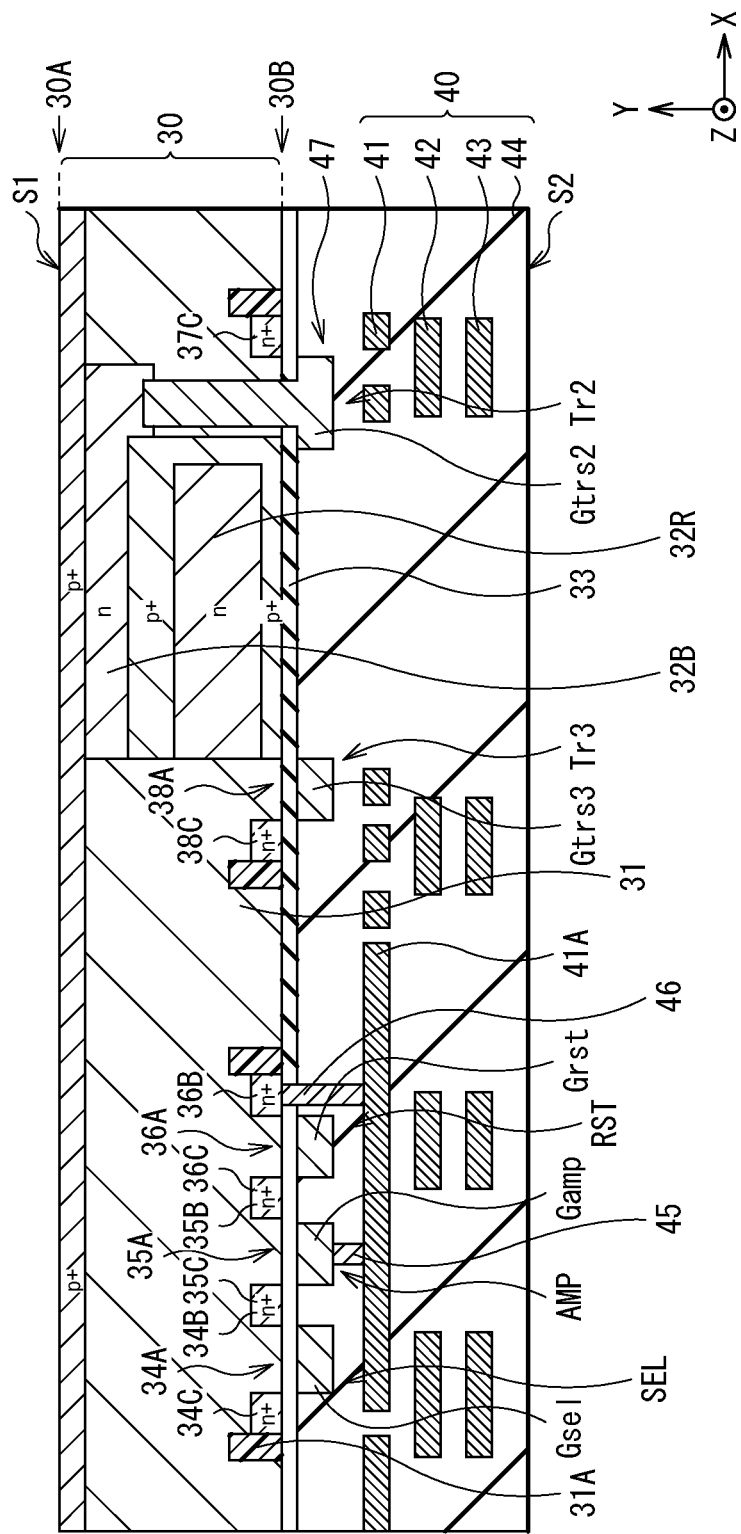
FIG. 4 is a cross-sectional view for describing a method of manufacturing the imaging element illustrated in FIG. 1.

FIGS. 4 to 10 illustrate a method of manufacturing the imaging element 10 in process order. First, as illustrated in FIG. 4, the p-well 31, for example, is formed as a well of a first conductivity type in the semiconductor substrate 30, and the inorganic photoelectric converters 32B and 32R of a second conductivity type (for example, the n type) are formed inside the p-well 31. A p+ region is formed in proximity to the first surface 30A of the semiconductor substrate 30.

As also illustrated in FIG. 4, on the second surface 30B of the semiconductor substrate 30, n+ regions serving as the floating diffusions FD1 to FD3 are formed, and thereafter, a gate insulation layer 33 and a gate wiring layer 47 including respective gates of the transfer transistor Tr2, the transfer transistor Tr3, the selection transistor SEL, the amplifier transistor AMP, and the reset transistor RST are formed. The transfer transistor Tr2, the transfer transistor Tr3, the selection transistor SEL, the amplifier transistor AMP, and the reset transistor RST are thereby formed. Moreover, the multilayer wiring layer 40 including the first lower contact 45, the second lower contact 46, the wiring layers 41 to 43 including the coupling section 41A, and the insulation layer 44 is formed on the second surface 30B of the semiconductor substrate 30.

As a base substrate of the semiconductor substrate 30, an SOI (Silicon on Insulator) substrate in which the semiconductor substrate 30, an embedded oxide film (not illustrated), and a retaining substrate (not illustrated) are stacked is used. The embedded oxide film and the retaining substrate are not illustrated in FIG. 4, but are joined to the first surface 30A of the semiconductor substrate 30. Annealing treatment is performed after ion implantation.

Next, a supporting substrate (not illustrated), another semiconductor base, or the like is joined to the second surface 30B side of the semiconductor substrate 30 (the multilayer wiring layer 40 side) and flipped from top to bottom. Subsequently, the semiconductor substrate 30 is separated from the embedded oxide film and the retaining substrate of the SOI substrate to cause the first surface 30A of the semiconductor substrate 30 to be exposed. It is possible to perform the above processes with technologies used in a typical CMOS process such as ion implantation and CVD (Chemical Vapor Deposition).

Figure 5:
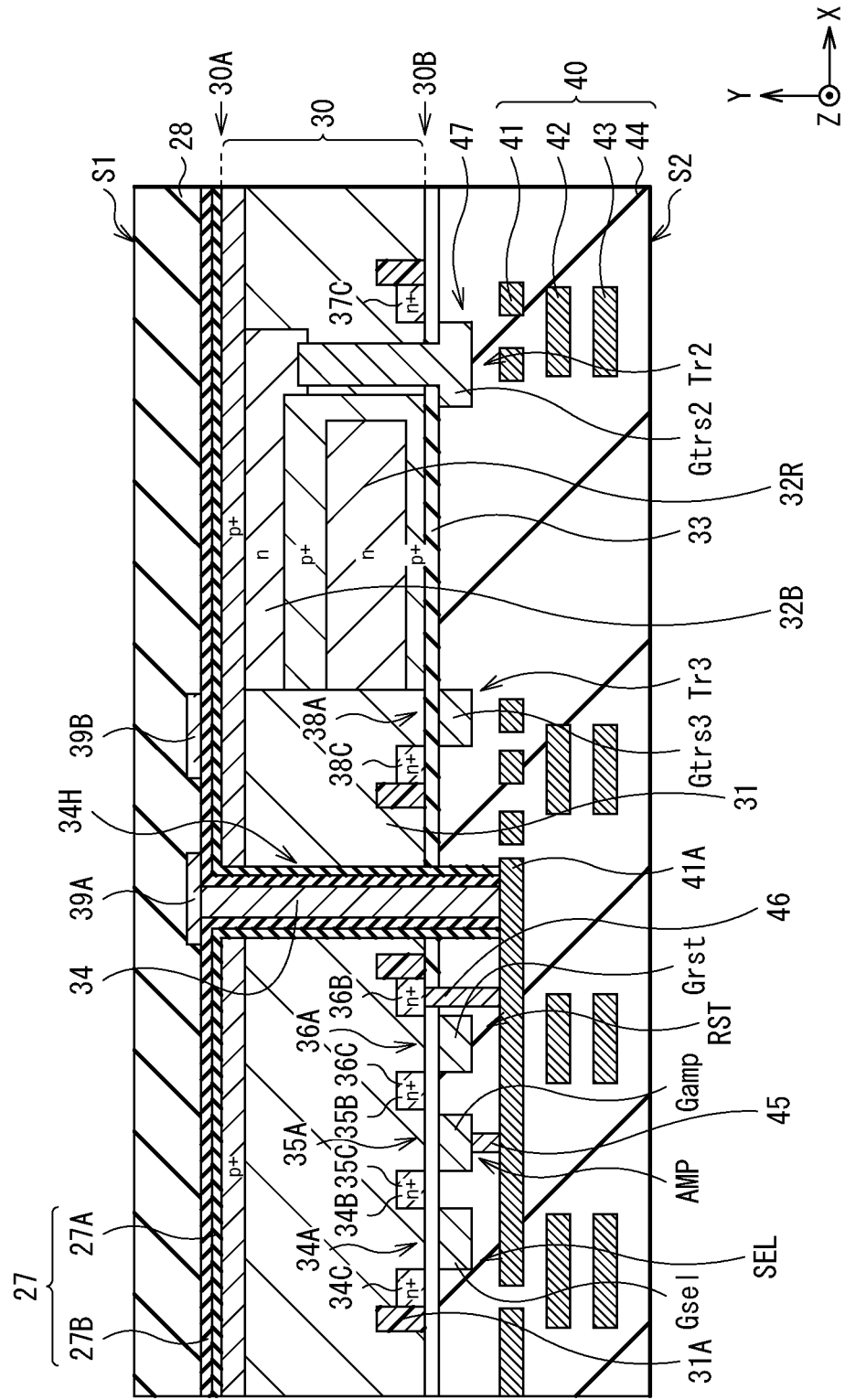
FIG. 5 is a cross-sectional view of a process subsequent to FIG. 4.

Next, as illustrated in FIG. 5, the semiconductor substrate 30 is processed from the first surface 30A side by dry etching, for example, to form an annular opening 34H. A depth of the opening 34H penetrates from the first surface 30A to the second surface 30B of the semiconductor substrate 30, and reaches the coupling section 41A, for example, as illustrated in FIG. 5.

Subsequently, for example, the negative fixed electric charge layer 27A is formed on the first surface 30A of the semiconductor substrate 30 and a side surface of the opening 34H. Two or more kinds of films may be stacked as the negative fixed electric charge layer 27A. This makes it possible to further enhance a function as the hole accumulation layer. The negative fixed electric charge layer 27A is formed, and thereafter the dielectric layer 27B is formed. Next, pad sections 39A and 39B are formed at predetermined positions on the dielectric layer 27B, and thereafter, the interlayer insulating layer 28 is formed on the dielectric layer 27B and the pad sections 39A and 39B, and a surface of the interlayer insulating layer 28 is planarized with use of a CMP (Chemical Mechanical Polishing) method.

Figure 6:
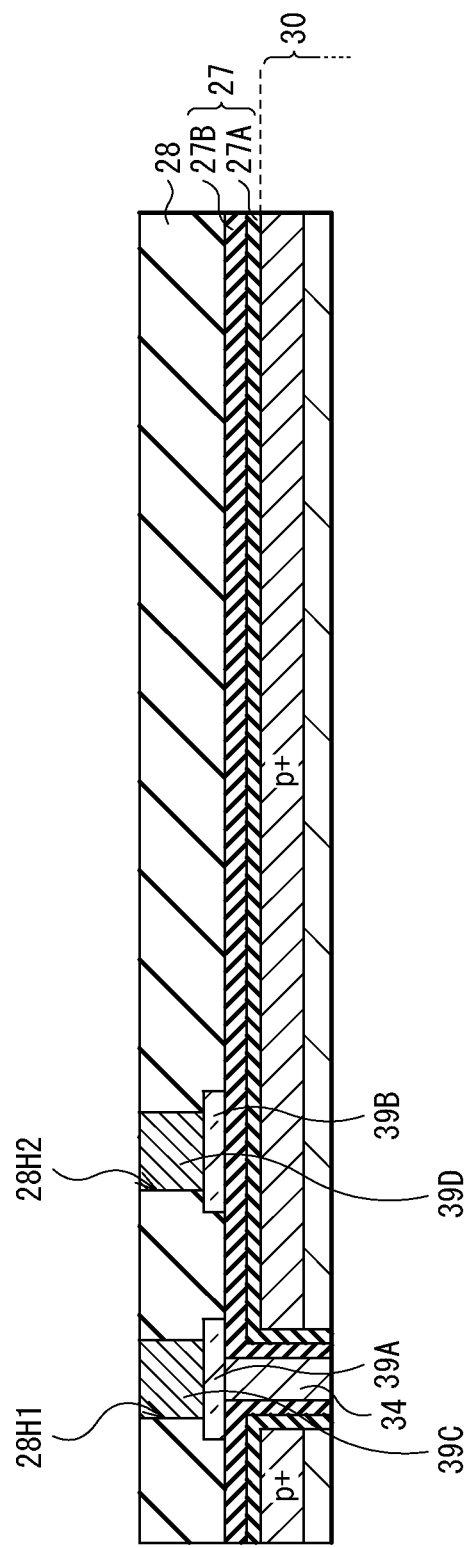
FIG. 6 is a cross-sectional view of a process subsequent to FIG. 5.

Subsequently, as illustrated in FIG. 6, openings 28H1 and 28H2 are respectively formed above the pad sections 39A and 39B, and thereafter the opening 28H1 and 28H2 are filled with an electrically-conductive material such as Al to form the first upper contact 39C and the second upper contact 39D.

Figure 7:
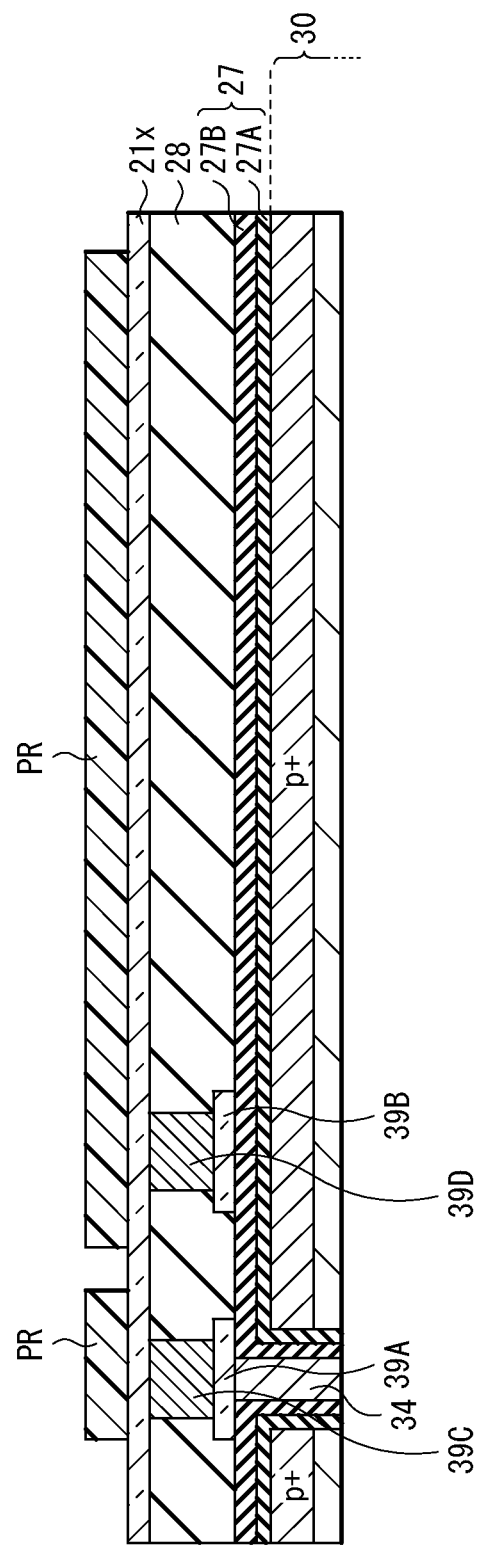
FIG. 7 is a cross-sectional view of a process subsequent to FIG. 6.
Figure 8:
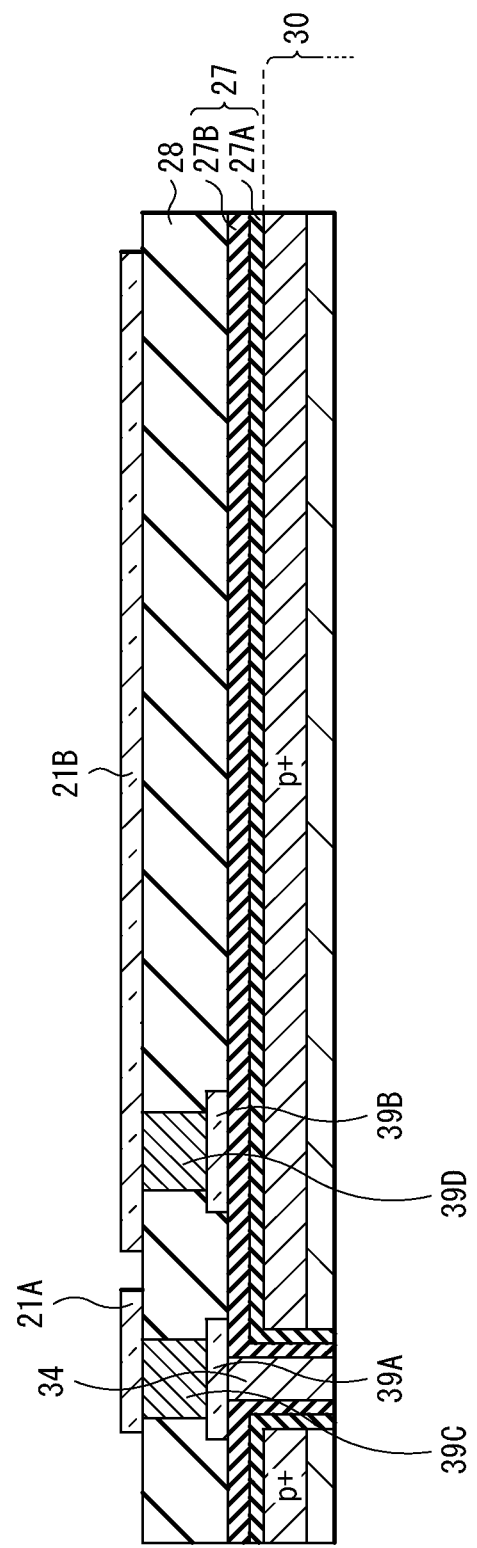
FIG. 8 is a cross-sectional view of a process subsequent to FIG. 7.

Subsequently, as illustrated in FIG. 7, an electrically-conductive film 21x is formed on the interlayer insulating layer 28, and thereafter a photoresist PR is formed at a predetermined position of the electrically-conductive film 21x. Thereafter, the readout electrode 21A and the accumulation electrode 21B illustrated in FIG. 8 are patterned by etching and removal of the photoresist PR.

Figure 9:
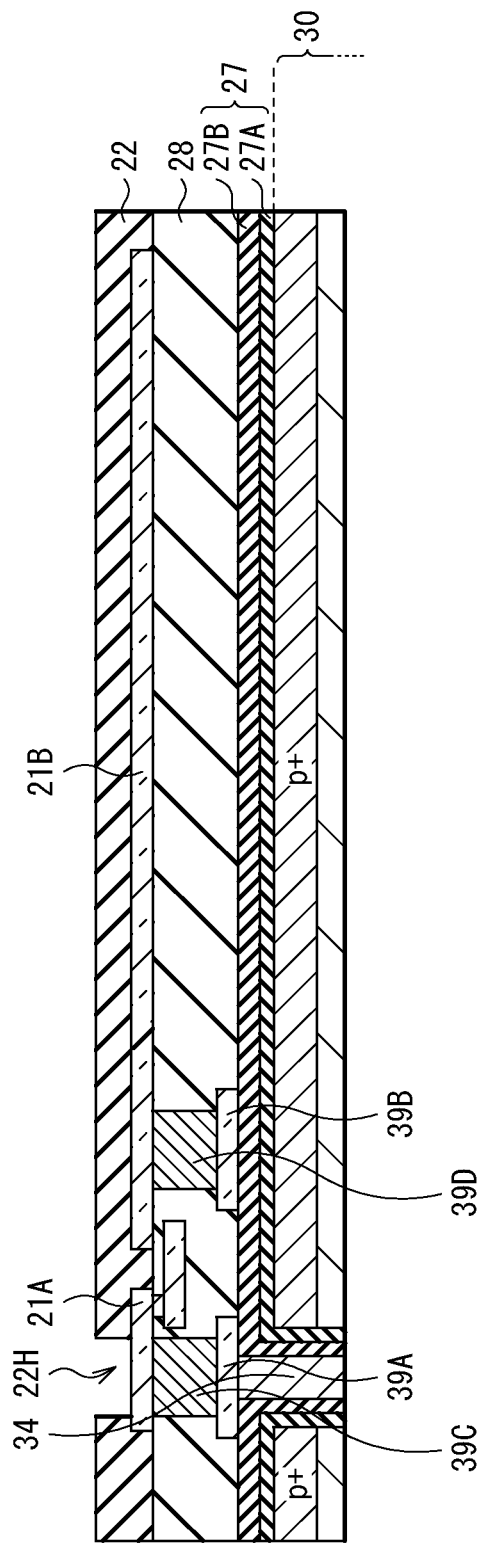
FIG. 9 is a cross-sectional view of a process subsequent to FIG. 8.

Next, as illustrated in FIG. 9, the insulating layer 22 is formed on the interlayer insulating layer 28, the readout electrode 21A, and the accumulation electrode 21B, and thereafter the opening 22H is provided above the readout electrode 21A.

Figure 10:
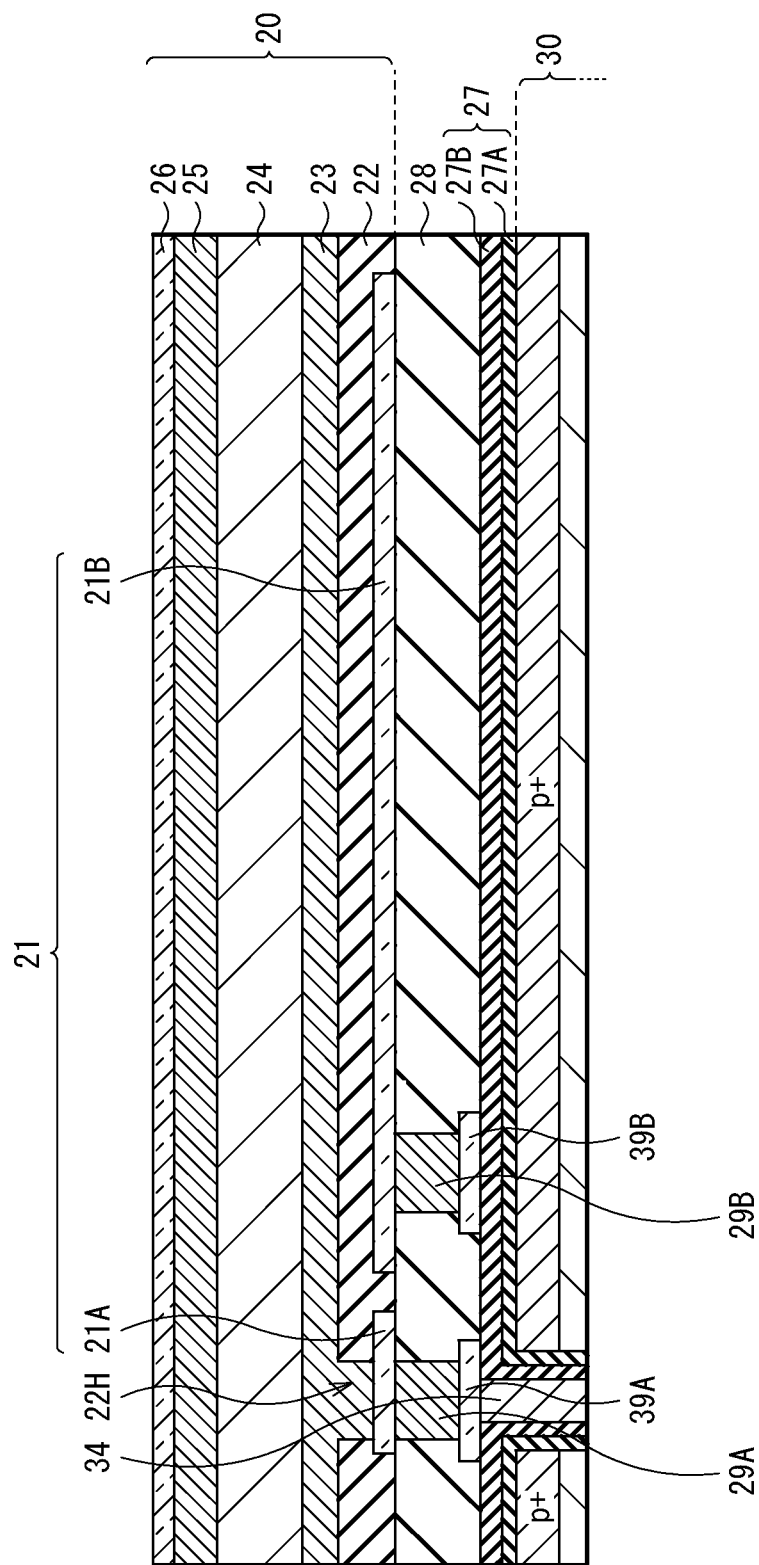
FIG. 10 is a cross-sectional view of a process subsequent to FIG. 9.

Next, as illustrated in FIG. 10, the electric charge accumulation layer 23, the photoelectric conversion layer 24, the work function adjustment layer 25, the upper electrode 26, the protective layer 29, and the light-shielding film 51 are formed on the insulating layer 22. It is to be noted that in a case where the electric charge accumulation layer 23 and the work function adjustment layer 25 are formed using an organic material, it is desirable to form the electric charge accumulation layer 23, the photoelectric conversion layer 24, and the work function adjustment layer 25 continuously in a vacuum process (in-situ vacuum process). In addition, the method of forming the photoelectric conversion layer 24 is not necessarily limited to a technique using a vacuum deposition method, and, other techniques, for example, a spin coat technology, a printing technology, and the like may also be used. Lastly, the optical member such as the planarization layer and the on-chip lens 52 are disposed. Thus, the imaging element 10 illustrated in FIG. 1 is completed.

In the imaging element 10, in a case where light enters the organic photoelectric converter 20 via the on-chip lens 52, the light passes through the organic photoelectric converter 20 and the inorganic photoelectric converters 32B and 32R in this order, and each of green light, blue light, and red light is photoelectrically converted in the course of passing. In the following, signal acquisition operations of the respective colors are described.

(Acquisition of Green Signal by Organic Photoelectric Converter 20)

Of light having entered the imaging element 10, first, green light is selectively detected (absorbed) and photoelectrically converted in the organic photoelectric converter 20.

The organic photoelectric converter 20 is coupled to the gate Gamp of the amplifier transistor AMP and the floating diffusion FD1 via the through electrode 34. Thus, electrons of electron-hole pairs generated in the organic photoelectric converter 20 are extracted from the lower electrode 21 side, transferred to the second surface 30B side of the semiconductor substrate 30 via the through electrode 34, and accumulated in the floating diffusion FD1. Simultaneously with this, the amount of electric charges generated in the organic photoelectric converter 20 is modulated into voltage by the amplifier transistor AMP.

In addition, the reset gate Grst of the reset transistor RST is disposed adjacent to the floating diffusion FD1. Accordingly, the electric charges accumulated in the floating diffusion FD1 are reset by the reset transistor RST.

Herein, the organic photoelectric converter 20 is coupled not only to the amplifier transistor AMP but also to the floating diffusion FD1 via the through electrode 34, thus making it possible for the reset transistor RST to easily reset the electric charges accumulated in the floating diffusion FD1.

In contrast to this, in a case where the through electrode 34 is not coupled to the floating diffusion FD1, it is difficult to reset the electric charges accumulated in the floating diffusion FD1, causing the electric charges to be drawn to the upper electrode 26 side by application of a large voltage. This may damage the photoelectric conversion layer 24. In addition, a configuration that enables resetting in a short period of time causes an increase in dark time noise, thereby resulting in a trade-off, therefore, this configuration is difficult.

Figure 11:
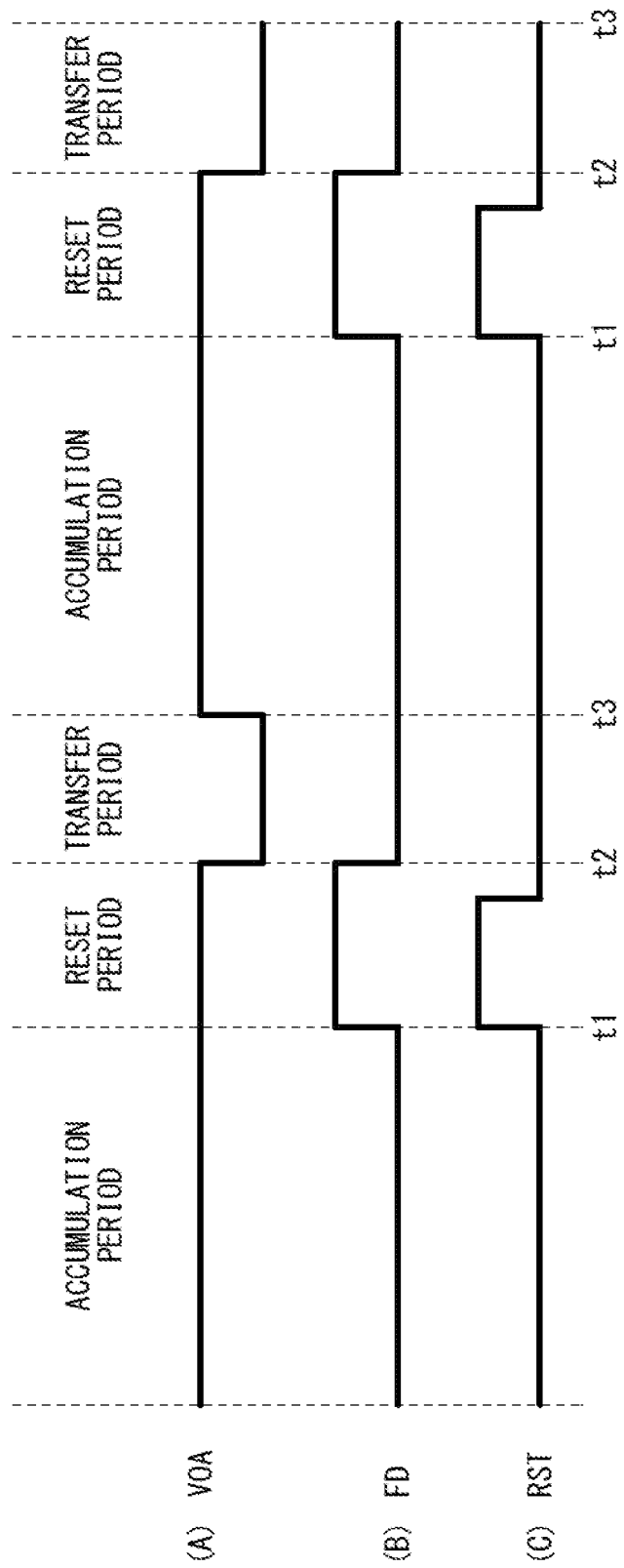
FIG. 11 is a timing chart illustrating an operation example of the imaging element illustrated in FIG. 1.

FIG. 11 illustrates an operation example of the imaging element 10. (A) indicates a potential in the accumulation electrode 21B; (B) indicates a potential in the floating diffusion FD1 (the readout electrode 21A); and (C) indicates a potential in the gate (Gsel) of the reset transistor TR1rst. In the imaging element 10, a voltage is individually applied to each of the readout electrode 21A and the accumulation electrode 21B.

In the imaging element 10, in an accumulation period, the drive circuit applies a potential V1 to the readout electrode 21A, and applies a potential V2 to the accumulation electrode 21B. Herein, the potentials V1 and V2 have a relationship of V2>V1. Accordingly, electric charges (herein, electrons) generated by photoelectric conversion are drawn to the accumulation electrode 21B, and accumulated in a region of the electric charge accumulation layer 23 opposed to the accumulation electrode 21B (the accumulation period). In this regard, a value of a potential in the region of the electric charge accumulation layer 23 opposed to the accumulation electrode 21B becomes more negative with the passage of time of photoelectric conversion. It is to be noted that holes are sent from the upper electrode 26 to the drive circuit.

In the imaging element 10, a reset operation is performed in a late period of the accumulation period. Specifically, at a timing t1, a scanner turns a voltage of the reset signal RST from a low level to a high level. This causes the reset transistor TR1rst in the unit pixel P to be turned on, and as a result, a voltage of the floating diffusion FD1 is set to a power source voltage VDD, and the voltage of the floating diffusion FD1 is reset (a reset period).

After completion of the reset operation, readout of electric charges is performed. Specifically, at a timing t2, the drive circuit applies a potential V3 to the readout electrode 21A, and applies a potential V4 to the accumulation electrode 21B. Herein, the potentials V3 and V4 have a relationship of V3<V4. Accordingly, electric charges (herein, electrons) accumulated in a region corresponding to the accumulation electrode 21B are read from the readout electrode 21A to the floating diffusion FD1. That is, the electric charges accumulated in the electric charge accumulation layer 23 is read by a controller (a transfer period).

After completion of a readout operation, the drive circuit applies the potential V1 to the readout electrode 21A again, and applies the potential V2 to the accumulation electrode 21B again. Accordingly, electric charges (herein, electrons) generated by photoelectric conversion are drawn to the accumulation electrode 21B, and accumulated in the region of the photoelectric conversion layer 24 opposed to the accumulation electrode 21B (the accumulation period).

(Acquisition of Blue Signal and Red Signal by Inorganic Photoelectric Converters 32B and 32R)

Subsequently, blue light and red light of the light having passed through the organic photoelectric converter 20 are absorbed and photoelectrically converted in sequence respectively in the inorganic photoelectric converter 32B and the inorganic photoelectric converter 32R. In the inorganic photoelectric converter 32B, electrons corresponding to the incident blue light are accumulated in the n region of the inorganic photoelectric converter 32B, and the accumulated electrons are transferred to the floating diffusion FD2 by the transfer transistor Tr2. Similarly, in the inorganic photoelectric converter 32R, electrons corresponding to the incident red light are accumulated in the n region of the inorganic photoelectric converter 32R, and the accumulated electrons are transferred to the floating diffusion FD3 by the transfer transistor Tr3.

1-3. Workings and Effects

In an imaging apparatus that separately extracts signals of B/G/R from one pixel, as described above, electric charges generated in a semiconductor substrate are temporarily accumulated in each of photoelectric converters (photodiodes PD1 and PD2) formed in the semiconductor substrate, and thereafter are each transferred to a corresponding one of floating diffusions FD. This makes it possible to fully deplete each of the photoelectric converters. In contrast, electric charges photoelectrically converted by an organic photoelectric converter are directly accumulated in the floating diffusion FD provided in the semiconductor substrate through a vertical transfer path provided in the semiconductor substrate. Accordingly, it is difficult to fully deplete a photoelectric conversion layer, and as a result, kTC noise is increased and random noise is worsened, resulting in deterioration in image quality in imaging.

As a method of solving this issue, an imaging element provided with an electrode for electric charge accumulation has been contrived. The electrode for electric charge accumulation is disposed separately from one electrode (for example, a lower electrode) of electrodes opposed to each other with a photoelectric conversion layer interposed therebetween, and is opposed to the photoelectric conversion layer with an insulating layer interposed therebetween. Electric charges generated in the photoelectric conversion layer is accumulated in a region opposed to the electrode for electric charge accumulation in the photoelectric conversion layer. The accumulated electric charges are transferred and read to an electric charge readout electrode side as appropriate. This makes it possible to fully deplete an electric charge accumulation section at the time of start of exposure, thereby suppressing kTC noise and improving image quality in imaging. In addition, in the above-described imaging element, the photoelectric conversion layer has a stacking configuration of a lower semiconductor layer including IGZO and an upper photoelectric conversion layer, which makes it possible to prevent recombination of electric charges during electric charge accumulation and further improve transfer efficiency of accumulated electric charges to the electric charge readout electrode.

Incidentally, in the organic photoelectric converter, in terms of a manufacturing process, the work function of the upper electrode tends to become shallower, as compared with the lower electrode. Accordingly, a gradient of a built-in electric field generated in the photoelectric conversion layer is turned to a state in which a potential on the upper electrode side is low, and of electric charges generated in the photoelectric conversion layer by light irradiation, in general, electrons and holes respectively flow to the upper electrode side and the electric charge accumulation layer, unless an external electric field (a reverse bias) high enough to cancel out the built-in electric field is applied. To transfer electrons to the electric charge accumulation layer, it is necessary to apply a reverse bias high enough to cancel out the built-in electric field; therefore, it is inevitably necessary to increase an operation potential. In addition, application of a high reverse bias is also necessary to transfer electric charges generated in the photoelectric conversion layer to the electric charge accumulation layer at high speed, and in a case where the reverse bias is not high enough, transfer may be delayed. Application of a high reverse bias may cause an increase in a dark current component to be injected from the upper electrode into the photoelectric conversion layer, and an effect thereof is more pronounced in a case where the work function of the upper electrode is shallow; therefore, appropriate adjustment of a work function around the upper electrode is an issue.

Figure 12:
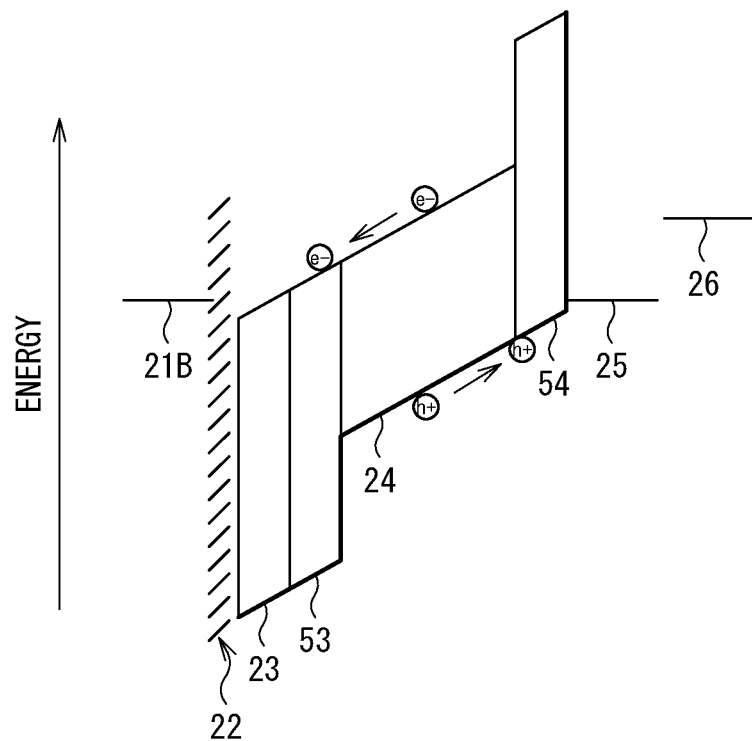
FIG. 12 is a diagram illustrating an example of energy levels of respective layers included in an organic photoelectric converter of an imaging element according to the present disclosure.

In contrast, in the present embodiment, the work function adjustment layer including a carbon-containing compound having an electron affinity larger than the work function of the lower electrode 21, in particular, the accumulation electrode 21B, or an inorganic compound having a work function larger than the work function of the accumulation electrode 21B is provided between the photoelectric conversion layer 24 and the upper electrode 26. The work function adjustment layer 25 generates free carriers by interaction with a surrounding material or change in stoichiometric ratio, and acts as an effective electrode. This changes an internal electric field in the photoelectric conversion layer 24. For example, in the imaging element 10 in which the insulating layer 22, the electric charge accumulation layer 23, an n-type buffer layer 53, the photoelectric conversion layer 24, a p-type buffer layer 54, and the work function adjustment layer 25 are stacked in order from the lower electrode 21 side between the lower electrode 21 (the accumulation electrode 21B in the drawing) and the upper electrode 26, an energy level is as illustrated in FIG. 12. Accordingly, a dark current to be injected from the upper electrode 26 into the photoelectric conversion layer 24 is suppressed, and electrons (signal electric charges; e−) and holes (h+) generated in the photoelectric conversion layer 24 by light irradiation are respectively rapidly transferred to the electric charge accumulation layer 23 and the work function adjustment layer 25.

As described above, in the imaging element 10 according to the present embodiment, the work function adjustment layer 25 that is able to generate free carriers by interaction with a surrounding material or change in stoichiometric ratio and act as an effective electrode is provided between the photoelectric conversion layer 24 and the upper electrode 26. This makes it possible to suppress generation of a dark current to be injected from the upper electrode 26 into the photoelectric conversion layer 24 and rapidly transfer, to the electric charge accumulation layer 23, each of signal electric charges generated in the photoelectric conversion layer 24 by light irradiation. This consequently makes it possible to improve image quality in imaging.

Next, description is given of modification examples (modification examples 1 to 3) of the present disclosure. In the following, components similar to those in the above-described embodiment are denoted by same reference numerals, and description thereof is omitted where appropriate.

2. Modification Examples

2-1. Modification Example 1

Figure 13:
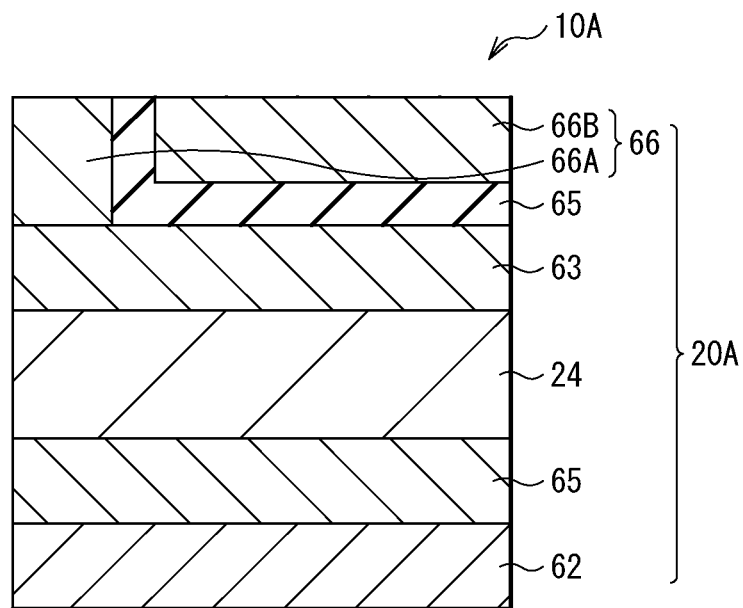
FIG. 13 is a schematic cross-sectional view of an example of a schematic configuration of a main part of an imaging element according to a modification example 1 of the present disclosure.

FIG. 13 illustrates a cross-sectional configuration of a main part (an organic photoelectric converter 20A) of an imaging element (an imaging element 10A) according to the modification example 1 of the present disclosure. The imaging element 10A is included in one pixel (a unit pixel P) of an imaging apparatus (the imaging apparatus 1; refer to FIG. 17) such as a CMOS image sensor used for an electronic apparatus such as a digital still camera and a video camera, for example. In the imaging element 10A according to the present modification example, of a pair of electrodes that are opposed to each other with the photoelectric conversion layer 24 interposed therebetween, one electrode includes a plurality of electrodes similarly to the imaging element 10 according to the above-described embodiment. The present modification example differs from the above-described embodiment in that an upper electrode 66 includes a plurality of electrodes (a readout electrode 66A and an accumulation electrode 66B) and a work function adjustment layer 65, the photoelectric conversion layer 24, and an electric charge accumulation layer 63 are stacked in this order from a lower electrode 61 side.

The lower electrode 61 includes an electrically conductive film having light transmissivity similarly to the lower electrode 21, and includes ITO (indium tin oxide), for example. However, in addition to ITO, a tin oxide ($SnO_2$)-based material doped with a dopant, or a zinc oxide-based material prepared by doping zinc oxide (ZnO) with a dopant may be used as a material of the lower electrode 61. Examples of the zinc oxide-based material include aluminum zinc oxide (AZO) doped with aluminum (Al) as a dopant, gallium zinc oxide (GZO) doped with gallium (Ga), and indium zinc oxide (IZO) doped with indium (In). In addition to these materials, CuI, $InSbO_4$, ZnMgO, $CuInO_2$, $MgIN_2O_4$, CdO, $ZnSnO_3$ or the like may be used.

The work function adjustment layer 65 is provided on the lower electrode 61, and changes an internal electric field in the photoelectric conversion layer 24 to rapidly transfer and accumulate, into the electric charge accumulation layer 63 provided on the upper electrode 66 side, signal electric charges (herein, holes) generated in the photoelectric conversion layer 24 similarly to the above-described work function adjustment layer 25. It is possible to form the work function adjustment layer 65 using a carbon-containing compound having an electron affinity larger than the work function of the accumulation electrode 66B. Examples of such a material include a tetracyanoquinodimethane derivative such as 2,3,5,6-tetrafluoro-tetracyanoquinodimethane (F4-TCNQ), 2,3,5-trifluoro-tetracyanoquinodimethane (F3-TCNQ), 2,5-difluoro-tetracyanoquinodimethane (F2-TCNQ), 2-fluoro-tetracyanoquinodimethane (F1-TCNQ), 2-trifluoromethyl-tetracyanoquinodimethane (CF3-TCNQ), and 1,3,4,5,7,8-hexafluoro-tetracyanonaphthoquinodimethane (F6-TCNQ), a hexaazatriphenylene derivative such as 1,4,5,8,9,12-hexaazatriphenylene-2,3,6,7,10,11-hexacarbonitrile (HATCN), a hexaazatrinaphthylene derivative such as 2,3,8,9,14,15-hexachloro-5,6,11,12,17,18-hexaazatrinaphthylene (HATNA-C16) and 2,3,8,9,14,15-hexafluoro-5,6,11,12,17,18-hexaazatrinaphthylene (HATNA-F6), a phthalocyanine derivative such as 1,2,3,4,8,9,10,11,15,16,17,18,22,23,24,25-hexadecafluoro-copper phthalocyanine (F16-CuPc), fluorinated fullerene such as C60F36 and C60F48, and the like. Alternatively, it is possible to form the work function adjustment layer 65 using an inorganic compound having a work function larger than the work function of the upper electrode 66 (specifically, the accumulation electrode 66B). Examples of such a material include a transition metal oxide having a single composition such as molybdenum oxide ($MoO_3$), tungsten oxide ($WO_3$), vanadium oxide ($V_2O_5$), and rhenium oxide ($ReO_3$), salts such as copper iodide (CuI), antimony chloride ($SbCl_5$), iron oxide ($FeCl_3$), and sodium chloride (NaCl), and the like. The work function adjustment layer 65 has a thickness of 0.5 nm to 30 nm, for example.

The electric charge accumulation layer 63 is provided above the photoelectric conversion layer 24, and accumulates, in a region corresponding to the accumulation electrode 25B, signal electric charges (herein, holes) generated in the photoelectric conversion layer 24. In the present modification example, holes are used as signal electric charges; therefore, the electric charge accumulation layer 63 is formed using a p-type semiconductor material. Low molecular weight compounds of the p-type semiconductor material include polycyclic aromatic hydrocarbon compounds such as anthracene, tetracene, pentacene, and rubrene, a chalcogen compound such as a benzothiophene derivative, a benzoxazole derivative, and a benzoselenophene derivative, and a nitrogen-containing compound such as a pyrrole derivative and a carbazole derivative. In addition, high molecular weight materials include aromatic hydrocarbon-based polymer such as polyparaphenylene and polyfluorene, a thiophene-based polymer such as polythiophene and polybenzothiophene, a nitrogen-containing polymer such as polypyrrole and polycarbazole, and copolymers thereof. The electric charge accumulation layer 63 has a thickness of 30 nm to 200 nm both inclusive, for example. Providing the electric charge accumulation layer 63 including the above-described material below the photoelectric conversion layer 24 makes it possible to prevent recombination of electric charges during electric charge accumulation and improve transfer efficiency.

Any other layer may be provided between the photoelectric conversion layer 24 and the lower electrode 61 and between the photoelectric conversion layer 24 and the upper electrode 66. Specifically, for example, the work function adjustment layer 65, a hole blocking film, the photoelectric conversion layer 24, an electron blocking film, the electric charge accumulation layer 63, and the like may be stacked in order from the lower electrode 61 side. Further, a undercoat layer and an electron transport layer may be provided between the lower electrode 21 and the photoelectric conversion layer 24, and a buffer layer or a hole transport layer may be provided between the photoelectric conversion layer 24 and the upper electrode 26.

The upper electrode 66 includes an electrically conductive film having light transmissivity similarly to the above-described lower electrode 61, and includes the readout electrode 66A and the accumulation electrode 66B that are separately formed as described above. The readout electrode 61A transfers, to the floating diffusion FD, electric charges (herein, holes) generated in the photoelectric conversion layer 24. The accumulation electrode 66B accumulates, in the electric charge accumulation layer 63, holes as signal electric charges of the electric charges generated in the photoelectric conversion layer 24. The accumulation electrode 63B is directly opposed to the light reception surfaces of the inorganic photoelectric converters 32B and 32R formed in the semiconductor substrate 30, and is provided in a region covering these light reception surfaces. The accumulation electrode 66B is preferably larger than the readout electrode 66A, which makes it possible to accumulate a large number of electric charges. An insulating layer 62 is provided between the upper electrode 66 and the electric charge accumulation layer 63. The insulating layer 62 has an opening directly below the readout electrode 66A similarly to the above-described insulating layer 22, and the readout electrode 66A and the electric charge accumulation layer 63 are thereby electrically coupling to each other.

The insulating layer 62 electrically separates the accumulation electrode 66B and the electric charge accumulation layer 63 from each other. The insulating layer 62 includes, for example, a single-layer film including one kind of silicon oxide, silicon nitride, silicon oxynitride (SiON), and the like, or a stacked film including two or more kinds thereof, similarly to the above-described insulating layer 22. The insulating layer 62 has a thickness of 20 nm to 500 nm, for example.

As described above, even in the imaging element 10A in which the upper electrode 66 includes a plurality of electrodes (the readout electrode 66A and the accumulation electrode 66B) and signal electric charges are accumulated in the electric charge accumulation layer 63 on the accumulation electrode 66B and are read from the readout electrode 66A, the work function adjustment layer 65 is provided between the lower electrode 61 and the photoelectric conversion layer 24, thereby suppressing generation of a dark current to be injected from the upper electrode 26 into the photoelectric conversion layer 24 and rapidly transferring, to the electric charge accumulation layer 63, signal electric charges generated in the photoelectric conversion layer 24 by light irradiation. This consequently makes it possible to improve image quality in imaging.

2-2. Modification Example 2

The work function adjustment layers 25 and 65 described in the embodiment and the modification example 1 described above may be formed using a composite oxide including two or more kinds of metal elements, for example.

Figure 14:
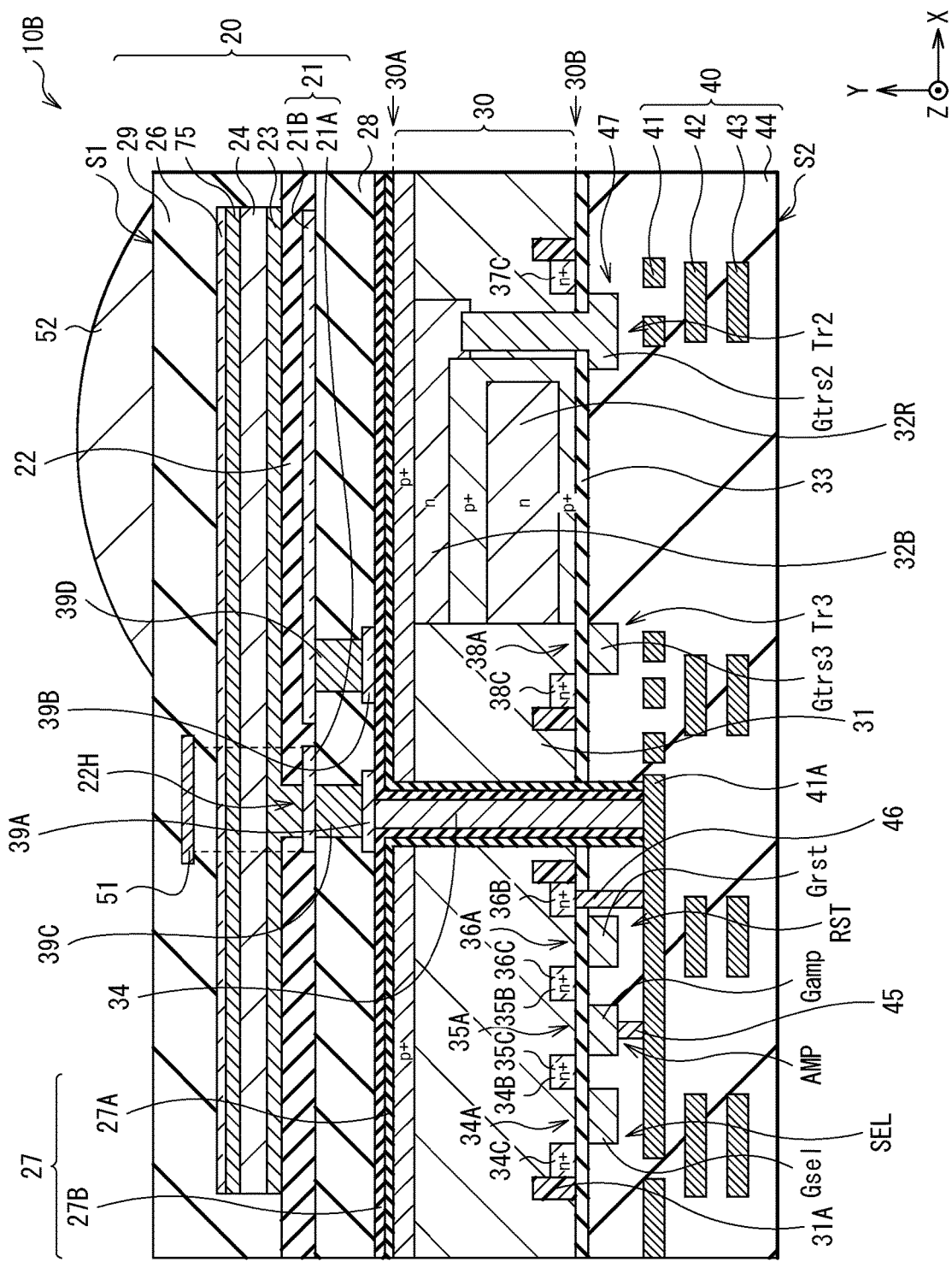
FIG. 14 is a schematic cross-sectional view of an example of a schematic configuration of an imaging element according to a modification example 2 of the present disclosure.

FIG. 14 illustrates an example of a cross-sectional configuration of an imaging element (an imaging element 10B) according to the modification example 2 of the present disclosure. The imaging element 10B is included in one pixel (a unit pixel P) of an imaging apparatus (the imaging apparatus 1; refer to FIG. 17) such as a CMOS image sensor used for an electronic apparatus such as a digital still camera and a video camera, for example. In the imaging element 10B according to the present modification example, of a pair of electrodes that are opposed to each other with the photoelectric conversion layer 24 interposed therebetween, one electrode includes a plurality of electrodes similarly to the imaging element 10 according to the above-described embodiment. The present modification example differs from the above-described embodiment in that a work function adjustment layer 75 is formed using a composite oxide including two or more kinds of metal elements.

The work function adjustment layer 75 is provided above the photoelectric conversion layer 24, specifically between the photoelectric conversion layer 24 and the upper electrode 26, and changes an internal electric field in the photoelectric conversion layer 24 to rapidly transfer and accumulate, into the electric charge accumulation layer 23, signal electric charges generated in the photoelectric conversion layer 24. The work function adjustment layer 75 has light transmissivity, and preferably has a light absorptance of 10% or less for visible light, for example. The work function adjustment layer 75 preferably has a work function larger than the work function of the accumulation electrode 21B. It is possible to form the work function adjustment layer 75 including a composite oxide including two or more kinds of metal elements.

Examples of two or more kinds of metal elements include a metal element included in a metal oxide having a high work function and a metal element included in a metal oxide (a high mobility oxide) having high mobility of electric charges (for example, electrons). The metal element included in the metal oxide having a high work function is a metal element taking a high oxidation state and having high electronegativity, and examples thereof include transition metal elements. Specific examples thereof include molybdenum (Mo), tungsten (W), vanadium (V), chromium (Cr), nickel (Ni), and rhenium (Re). The above-described transition metal elements in the high oxidation state include molybdenum ($Mo^{+6}$) having an oxidation number of +6, tungsten ($W^{+6}$) having an oxidation number of +6, vanadium ($V^{+6}$) having an oxidation number of +5, chromium ($Cr^{+6}$) having an oxidation number of +6, nickel ($Ni^{+4}$) having an oxidation number of +4, and rhenium ($Re^{+6}$ or $Re^{+7}$) having an oxidation number of +6 or +7. The metal element included in the high mobility oxide is a metal oxide having a large unoccupied s-orbital overlap and having high mobility, and examples thereof include typical metal elements. Specific examples thereof include indium (In), zinc (Zn), tin (Sn), and gallium (Ga).

The composite oxide is an oxide including at least one kind of the above-described transition metal element and at least one kind of the above-described typical metal elements. The composite oxide preferably includes the transition metal element within a range of 20 wt % to 80 wt % both inclusive and the typical metal element within a range of 20 wt % to 80 wt % both inclusive. That is, the composite oxide preferably includes the transition metal element and the typical metal element at a composition ratio of 2:8 to 8:2. Accordingly, the oxidation state of the transition metal element included in the work function adjustment layer 75 is stabilized, the transition metal element in the high oxidation state described above is included at 80 at % or more, and absorption at a wavelength of 700 nm, for example, is suppressed.

An organic compound may be further used to form the work function adjustment layer 75. Specific examples of the organic compound include a tetracyanoquinodimethane derivative such as 2,3,5,6-tetrafluoro-tetracyanoquinodimethane (F4-TCNQ), 2,3,5-trifluoro-tetracyanoquinodimethane (F3-TCNQ), 2,5-difluoro-tetracyanoquinodimethane (F2-TCNQ), 2-fluoro-tetracyanoquinodimethane (F1-TCNQ), 2-trifluoromethyl-tetracyanoquinodimethane (CF3-TCNQ), and 1,3,4,5,7,8-hexafluoro-tetracyanonaphthoquinodimethane (F6-TCNQ), a hexaazatriphenylene derivative such as 1,4,5,8,9,12-hexaazatriphenylene-2,3,6,7,10,11-hexacarbonitrile (HATCN), a hexaazatrinaphthylene derivative such as 2,3,8,9,14,15-hexachloro-5,6,11,12,17,18-hexaazatrinaphthylene (HATNA-C16) and 2,3,8,9,14,15-hexafluoro-5,6,11,12,17,18-hexaazatrinaphthylene (HATNA-F6), a phthalocyanine derivative such as 1,2,3,4,8,9,10,11,15,16,17,18,22,23,24,25-hexadecafluoro-copper phthalocyanine (F16-CuPc), fluorinated fullerene such as C60F36 and C60F48, and the like.

As described above, in the present modification example, the work function adjustment layer 75 is formed using at least one kind of the transition metal elements such as molybdenum (Mo), tungsten (W), vanadium (V), chromium (Cr), nickel (Ni), and rhenium (Re) and at least one kind of the typical metal elements such as indium (In), zinc (Zn), tin (Sn), and gallium (Ga). This makes it possible to improve stability of the oxidation state of the transition metal element and high mobility of electric charges (electrons). This consequently makes it possible to improve spectral characteristics, external quantum efficiency (EQE), dark current characteristics, and afterimage characteristics and further improve image quality in imaging.

2-3. Modification Example 3

In the imaging elements 10, 10A, and 10B described in the embodiment and the modification examples 1 and 2 described above, an exciton blocking layer 86 may be further provided between the photoelectric conversion layer 24 and, for example, the work function adjustment layer 25 (or the work function adjustment layer 65 or 75). The exciton blocking layer 86 corresponds to a specific example of a "third semiconductor layer" of the present disclosure.

Figure 15:
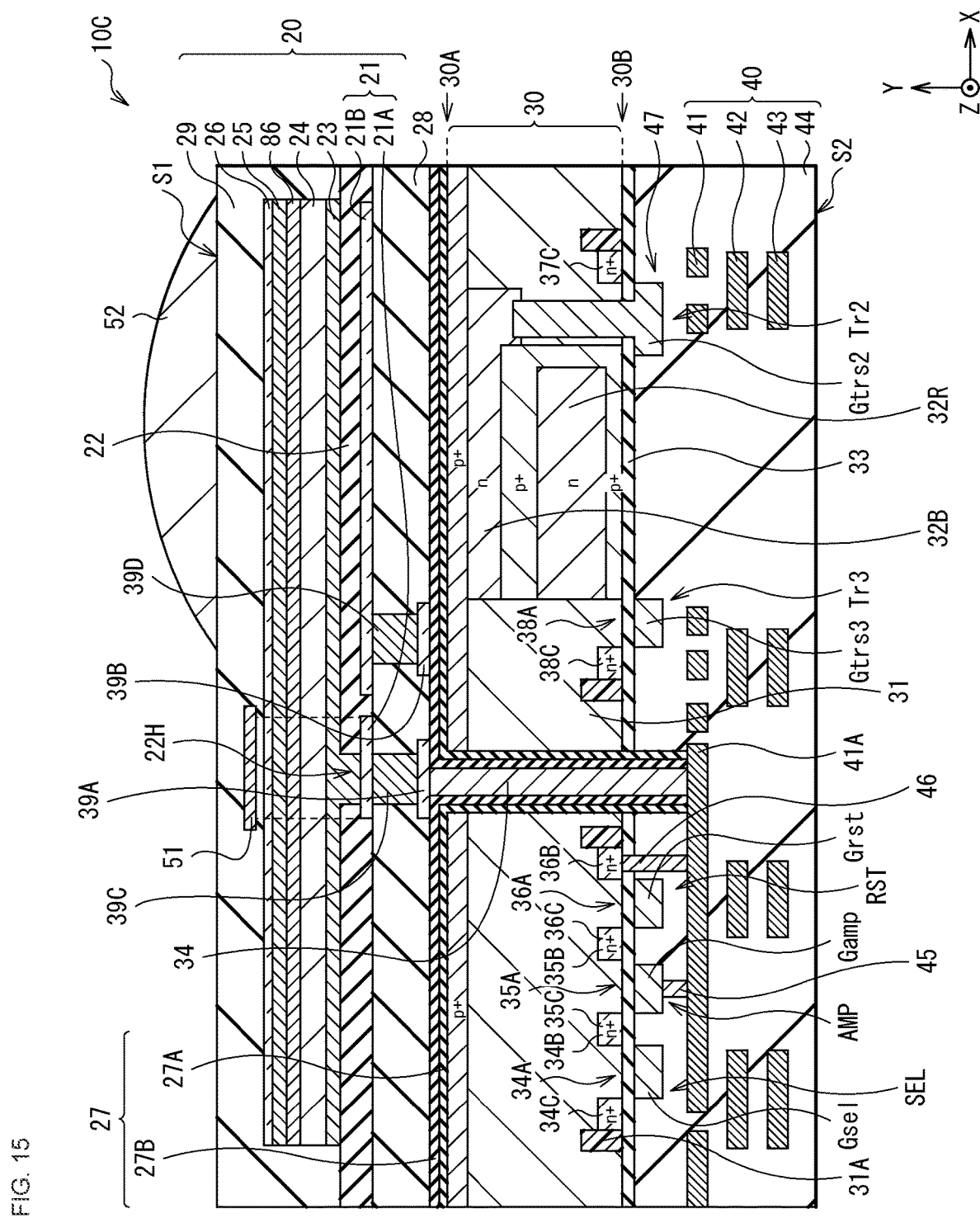
FIG. 15 is a schematic cross-sectional view of an example of a schematic configuration of an imaging element according to a modification example 3 of the present disclosure.

FIG. 15 illustrates an example of a cross-sectional configuration of an imaging element (an imaging element 10C) according to the modification example 3 of the present disclosure. The imaging element 10C is included in one pixel (a unit pixel P) of an imaging apparatus (the imaging apparatus 1; refer to FIG. 17) such as a CMOS image sensor used for an electronic apparatus such as a digital still camera and a video camera, for example. In the imaging element 10C according to the present modification example, of a pair of electrodes that are opposed to each other with the photoelectric conversion layer 24 interposed therebetween, one electrode includes a plurality of electrodes similarly to the imaging element 10 according to the above-described embodiment. The present modification example differs from the above-described embodiment in that the exciton blocking layer 86 is provided between the photoelectric conversion layer 24 and the work function adjustment layer 25.

Figure 16:
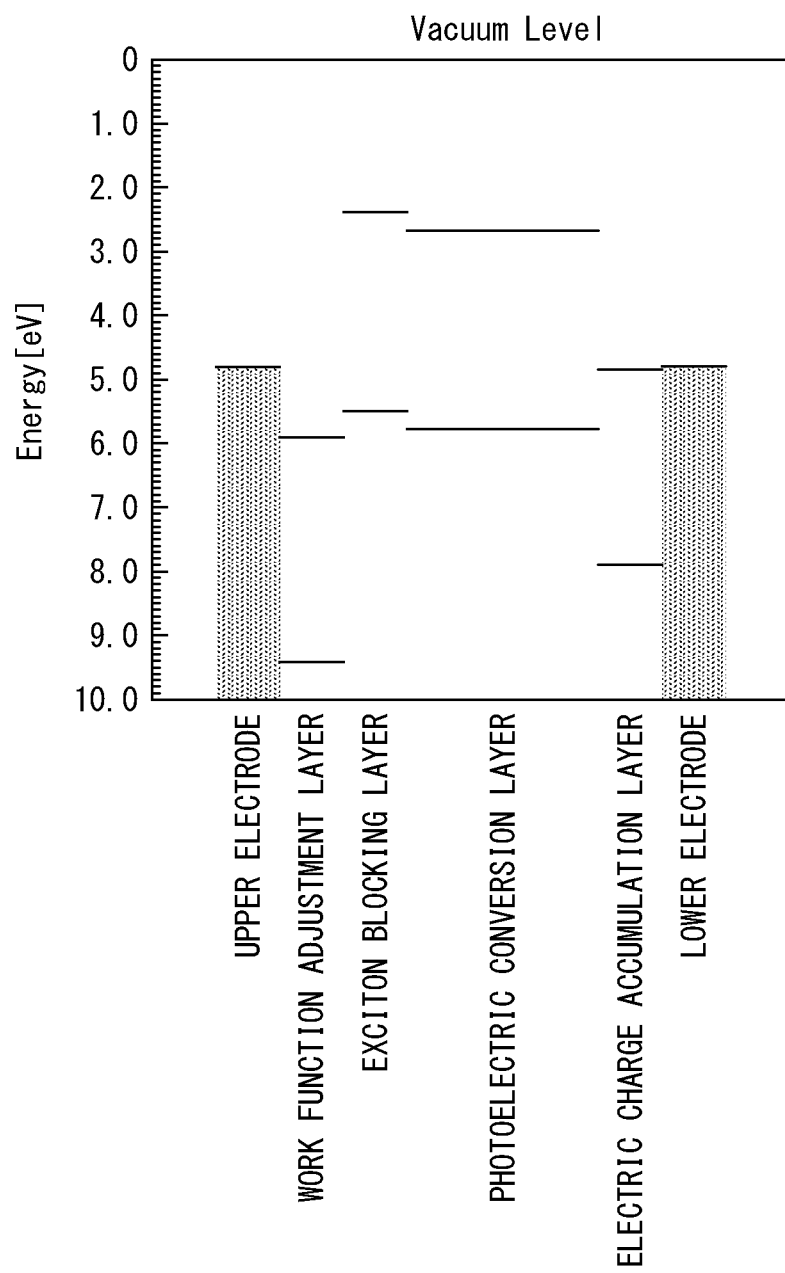
FIG. 16 is a diagram illustrating a relationship of energy levels of respective layers included in an organic photoelectric converter illustrated in FIG. 15.

The exciton blocking layer 86 is provided between the photoelectric conversion layer 24 and the work function adjustment layer 25, and suppresses injection of excitons and electrons generated in the photoelectric conversion layer 24 into the work function adjustment layer 25 and the upper electrode 26. The exciton blocking layer 86 desirably has a HOMO (Highest Occupied Molecular Orbital) or a work function as illustrated in FIG. 16. Specifically, for example, the exciton blocking layer 86 preferably has an energy level shallower than a HOMO (or the work function) of the work function adjustment layer 25. The exciton blocking layer 86 preferably has an energy level shallower than a HOMO of the photoelectric conversion layer 24. The exciton blocking layer 86 preferably has an energy level deeper than the work function of the upper electrode 26. This makes it possible for the exciton blocking layer 86 to suppress injection of excitons and electrons into the work function adjustment layer 25 and the upper electrode 26.

For example, it is possible to form the exciton blocking layer 86 using an organic material that has hole transportability and is included in the photoelectric conversion layer 24, specifically, an organic compound having a band gap larger than a dye material. Such organic compounds include aromatic amine-based materials typified by a triallylamine compound, a benzidine compound, and a styrylamine compound, a carbazole derivative, an indolocarbazole derivative, a naphthalene derivative, an anthracene derivative, a phenanthrene derivative, a pyrene derivative, a perylene derivative, a tetracene derivative, a pentacene derivative, a perylene derivative, a picene derivative, a chrysene derivative, a fluoranthene derivative, a phthalocyanine derivative, a subphthalocyanine derivative, a hexaazatriphenylene derivative, and a metal complex including a heterocyclic compound as a ligand, thienoacene-based materials typified by a thiophene derivative, a thienothiophene derivative, a benzothiophene derivative, a benzothienobenzothiophene (BTBT) derivative, a dinaphthothienothiophene (DNTT) derivative, a dianthracenothienothiophene (DATT) derivative, a benzobisbenzothiophene (BBBT) derivative, a thienobisbenzothiophene (TBBT) derivative, a dibenzothienobisbenzothiophene (DBTBT) derivative, a dithienobenzodithiophene (DTBDT) derivative, a dibenzothienothiophene (DBTDT) derivative, a benzodithiophene (BDT) derivative, a naphthodithiophene (NDT) derivative, an anthracenodithiophene (ADT) derivative, a tetracenodithiophene (TDT) derivative, and a pentacenodithiophene (PDT) derivative. Of the above-described organic compounds, an organic compound having a glass transition point higher than 100° C. is preferably used. In addition, it is possible to form the exciton blocking layer 86 using an organic material that has hole transportability and is included in the photoelectric conversion layer 24, specifically, an inorganic compound having a band gap larger than a dye material.

As described above, in the present modification example, the exciton blocking layer 86 is provided between the photoelectric conversion layer 24 and the work function adjustment layer 25. This reduces movement of excitons generated in the photoelectric conversion layer 24 to the work function adjustment layer 25 and the upper electrode 26. This makes it possible to improve EQE in addition to the effects of the above-described embodiment. This consequently makes it possible to further improve image quality in imaging.

3. Application Example

Application Example 1

Figure 17:
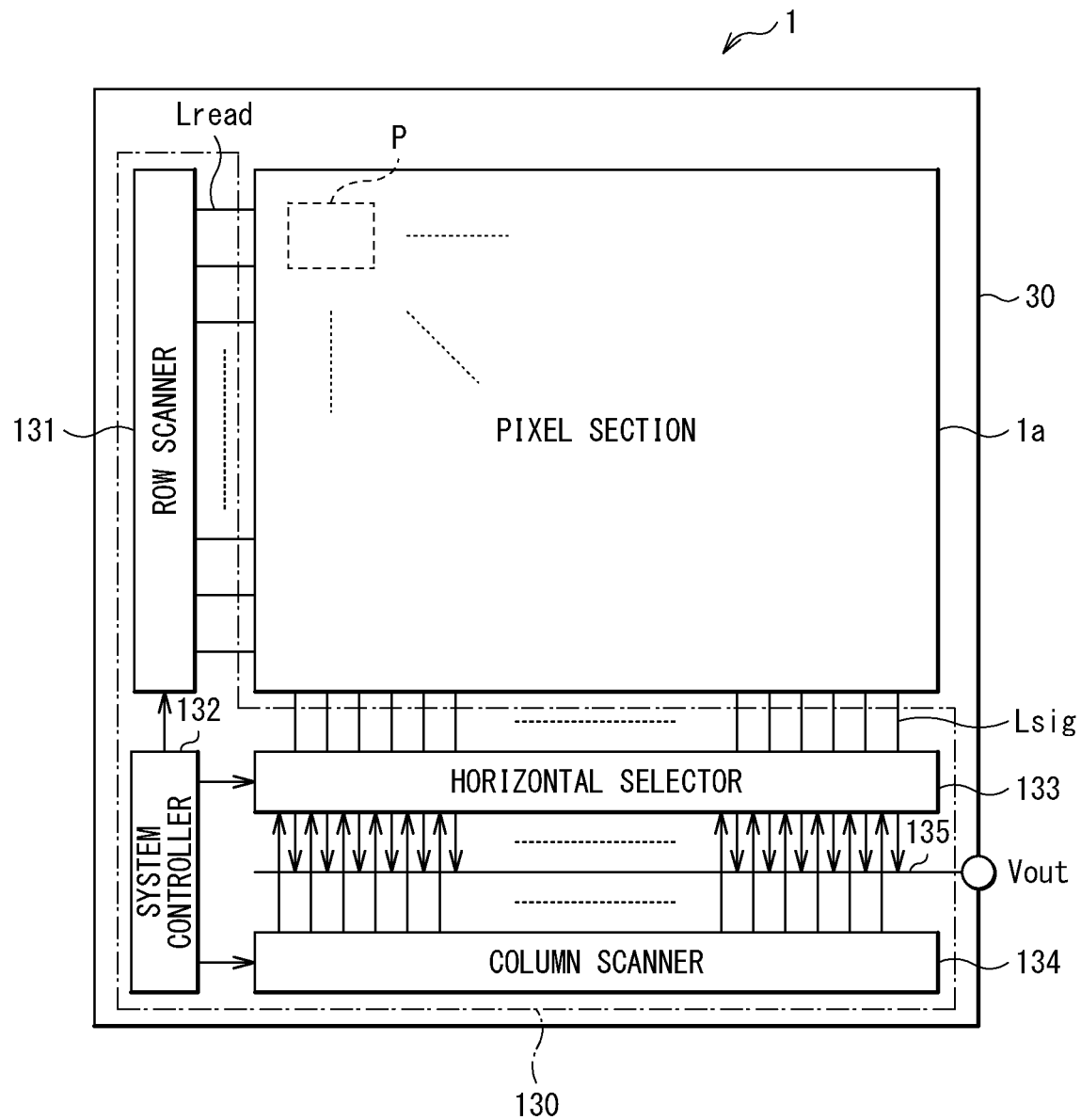

FIG. 17 illustrates an overall configuration of the imaging apparatus 1 using, for each of the pixels, the imaging element 10 (or the imaging element 10A, 10B, or 10C) described in the above-described embodiment (or any of the modification examples 1 to 3). The imaging apparatus 1 is a CMOS image sensor, and includes, on the semiconductor substrate 30, a pixel section 1a as an imaging region and a peripheral circuit section 130 including, for example, a row scanner 131, a horizontal selector 133, a column scanner 134, and a system controller 132 in a peripheral region of the pixel section 1a.

The pixel section 1a includes a plurality of unit pixels P (each corresponding to the imaging element 10) two-dimensionally arranged in a matrix, for example. The unit pixels P are wired with pixel drive lines Lread (specifically, row selection lines and reset control lines) for respective pixel rows, and vertical signal lines Lsig for respective pixel columns, for example. The pixel drive lines Lread transmit drive signals for signal reading from the pixels. The pixel drive lines Lread each have one end coupled to a corresponding one of output terminals, corresponding to the respective rows, of the row scanner 131.

The row scanner 131 includes a shift register, an address decoder, and the like, and is a pixel driver, for example, that drives the respective unit pixels P in the pixel section 1a on a row-by-row basis. A signal outputted from each of the unit pixels P of a pixel row selectively scanned by the row scanner 131 is supplied to the horizontal selector 133 through each of the vertical signal lines Lsig. The horizontal selector 133 includes an amplifier, a horizontal selection switch, and the like provided for each of the vertical signal lines Lsig.

The column scanner 134 includes a shift register, an address decoder, and the like, and drives respective horizontal selection switches of the horizontal selector 133 in sequence while scanning the horizontal selection switches. Such selective scanning by the column scanner 134 causes the signals of the respective pixels transmitted through the respective vertical signal lines Lsig to be outputted in sequence to a horizontal signal line 135 and thereafter transmitted to outside of the semiconductor substrate 30 through the horizontal signal line 135.

Circuit components including the row scanner 131, the horizontal selector 133, the column scanner 134, and the horizontal signal line 135 may be formed directly on the semiconductor substrate 30 or disposed in an external control IC. Alternatively, these circuit components may be formed in any other substrate coupled by a cable, or the like.

The system controller 132 receives a clock given from the outside of the semiconductor substrate 30, or data or the like on instructions of operation modes, and also outputs data such as internal information of the imaging apparatus 1. The system controller 132 further includes a timing generator that generates various timing signals, and performs drive control of the peripheral circuits such as the row scanner 131, the horizontal selector 133, and the column scanner 134, on the basis of the various timing signals generated by the timing generator.

Application Example 2

Figure 18:
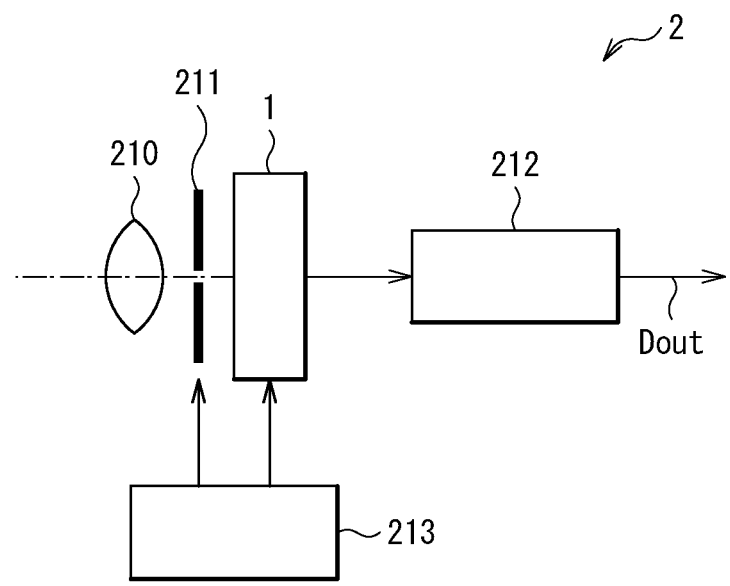
FIG. 18 is a functional block diagram illustrating an electronic apparatus (camera) using the imaging apparatus illustrated in FIG. 17.

The above-described imaging apparatus 1 is applicable to, for example, various kinds of electronic apparatuses having imaging functions. Examples of the electronic apparatuses include camera systems such as digital still cameras and video cameras and mobile phones having the imaging functions. FIG. 18 illustrates, for purpose of an example, a schematic configuration of an electronic apparatus 2 (camera). The electronic apparatus 2 is a video camera that enables shooting of a still image or a moving image, for example, and includes the imaging apparatus 1, an optical system (optical lens) 310, a shutter apparatus 311, a driver 313 that drives the imaging apparatus 1 and the shutter apparatus 311, and a signal processor 312.

The optical system 310 guides image light (incident light) from a subject to the pixel section 1*a* of the imaging apparatus 1. The optical system 310 may include a plurality of optical lenses. The shutter apparatus 311 controls a period in which the imaging apparatus 1 is irradiated with the light and a period in which the light is blocked. The driver 313 controls a transfer operation of the imaging apparatus 1 and a shutter operation of the shutter apparatus 311. The signal processor 312 performs various types of signal processing on signals outputted from the imaging apparatus 1. An image signal Dout having been subjected to the signal processing is stored in a storage medium such as a memory or outputted to a monitor or the like.

Practical Application Examples

Furthermore, the imaging apparatus 1 described above is also applicable to the following electronic apparatuses (a capsule type endoscope 10100 and a mobile body of a vehicle or the like).

<Practical Example to In-Vivo Information Acquisition System>

The technology (present technology) according to the present disclosure is applicable to various products. For example, the technology according to the present disclosure may be applied to an endoscopic surgery system.

Figure 19:
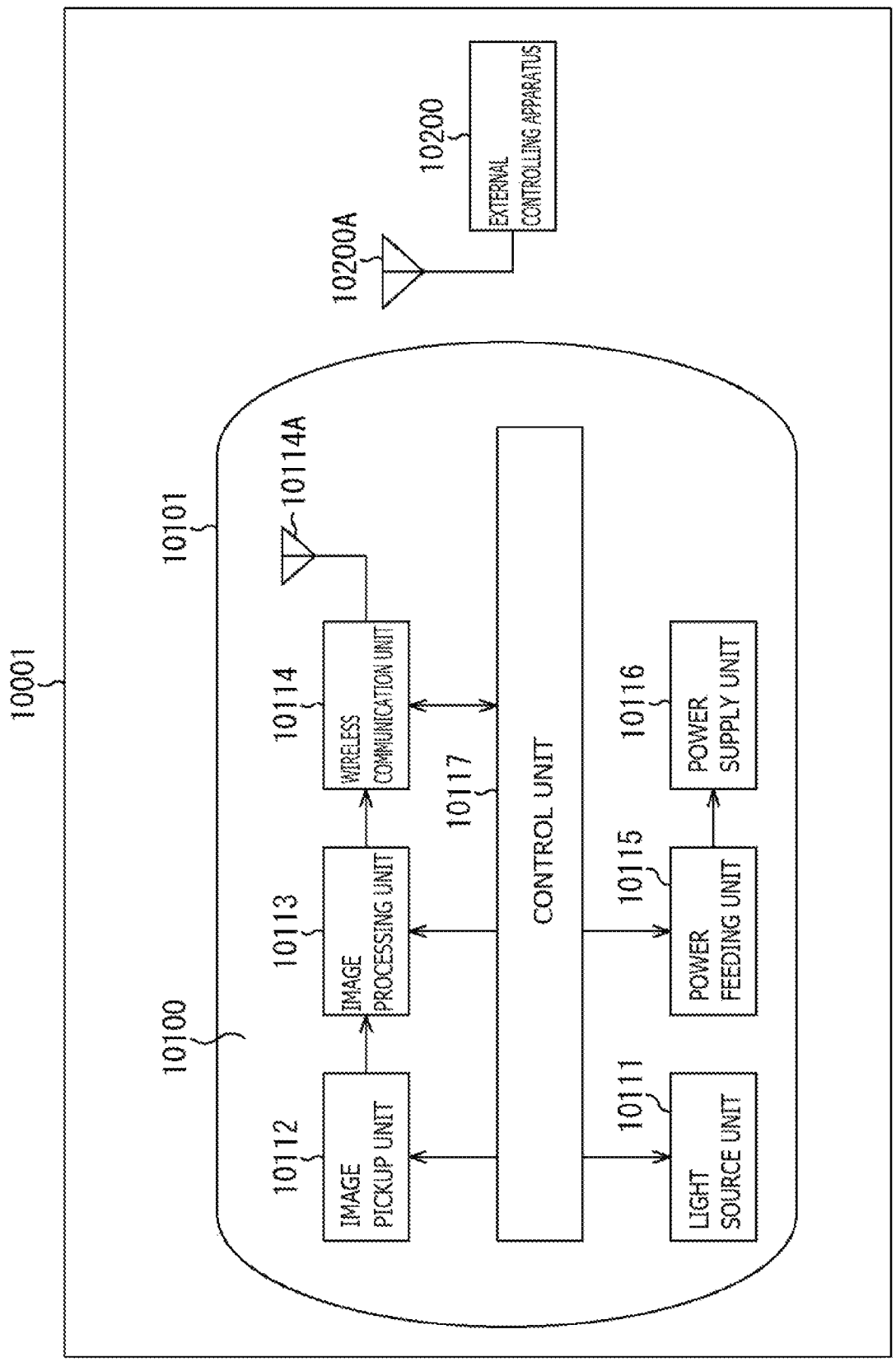
FIG. 19 is a block diagram depicting an example of a schematic configuration of an in-vivo information acquisition system.

FIG. 19 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 19, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure is applicable has been described above. The technology according to the present disclosure is applicable to, for example, the image pickup unit 10112 of the configurations described above. This makes it possible to improve accuracy of an inspection.

<Practical Example to Endoscopic Surgery System>

The technology (present technology) according to the present disclosure is applicable to various products. For example, the technology according to the present disclosure may be applied to an endoscopic surgery system.

Figure 20:
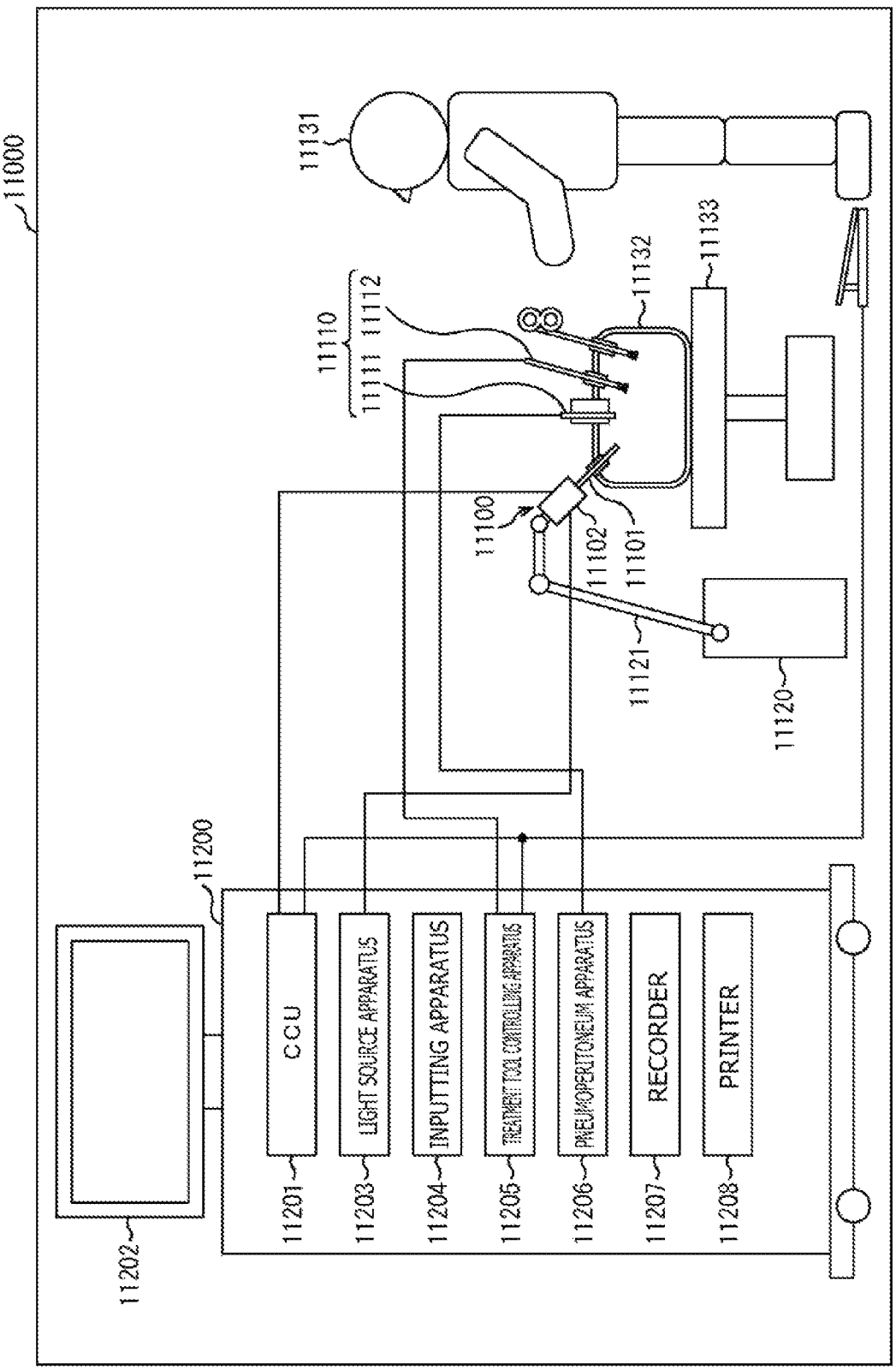
FIG. 20 is a view depicting an example of a schematic configuration of an endoscopic surgery system.

FIG. 20 is a view depicting an example of a schematic configuration of an endoscopic surgery system to which the technology according to an embodiment of the present disclosure (present technology) can be applied.

In FIG. 20, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 21:
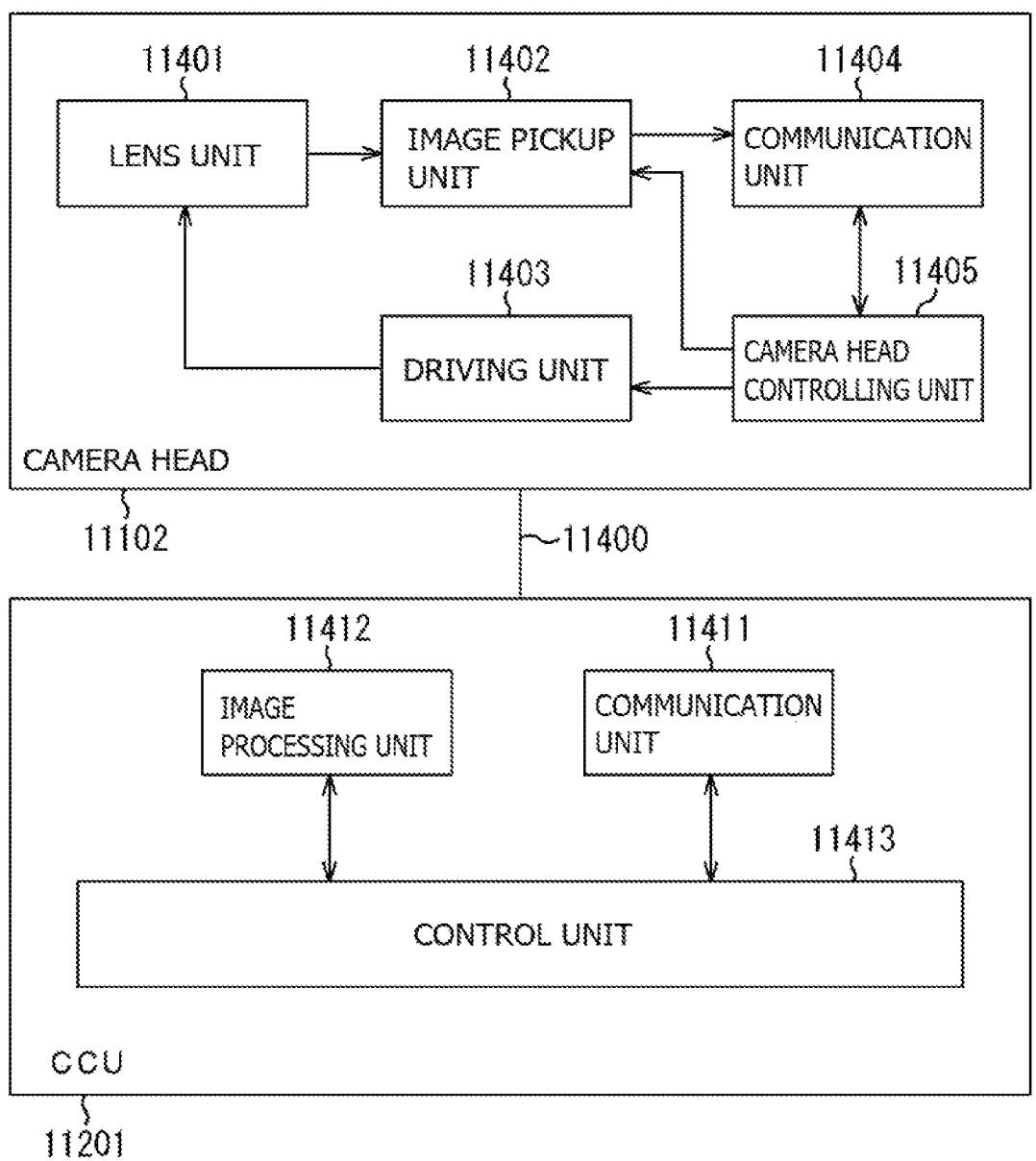
FIG. 21 is a block diagram depicting an example of a functional configuration of a camera head and a camera control unit (CCU).

FIG. 21 is a block diagram depicting an example of a functional configuration of the camera head 11102 and the CCU 11201 depicted in FIG. 20.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure is applicable has been described above. The technology according to the present disclosure is applicable to, for example, the image pickup unit 11402 of the configurations described above. Applying the technology according to the present disclosure to the image pickup unit 11402 makes it possible to improve accuracy of an inspection.

It is to be noted that the endoscopic surgery system has been described here as an example, but the technology according to the present disclosure may be additionally applied to, for example, a microscopic surgery system and the like.

<Practical Example to Mobile Body>

The technology according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, a robot, a construction machine, and an agricultural machine (tractor).

Figure 22:
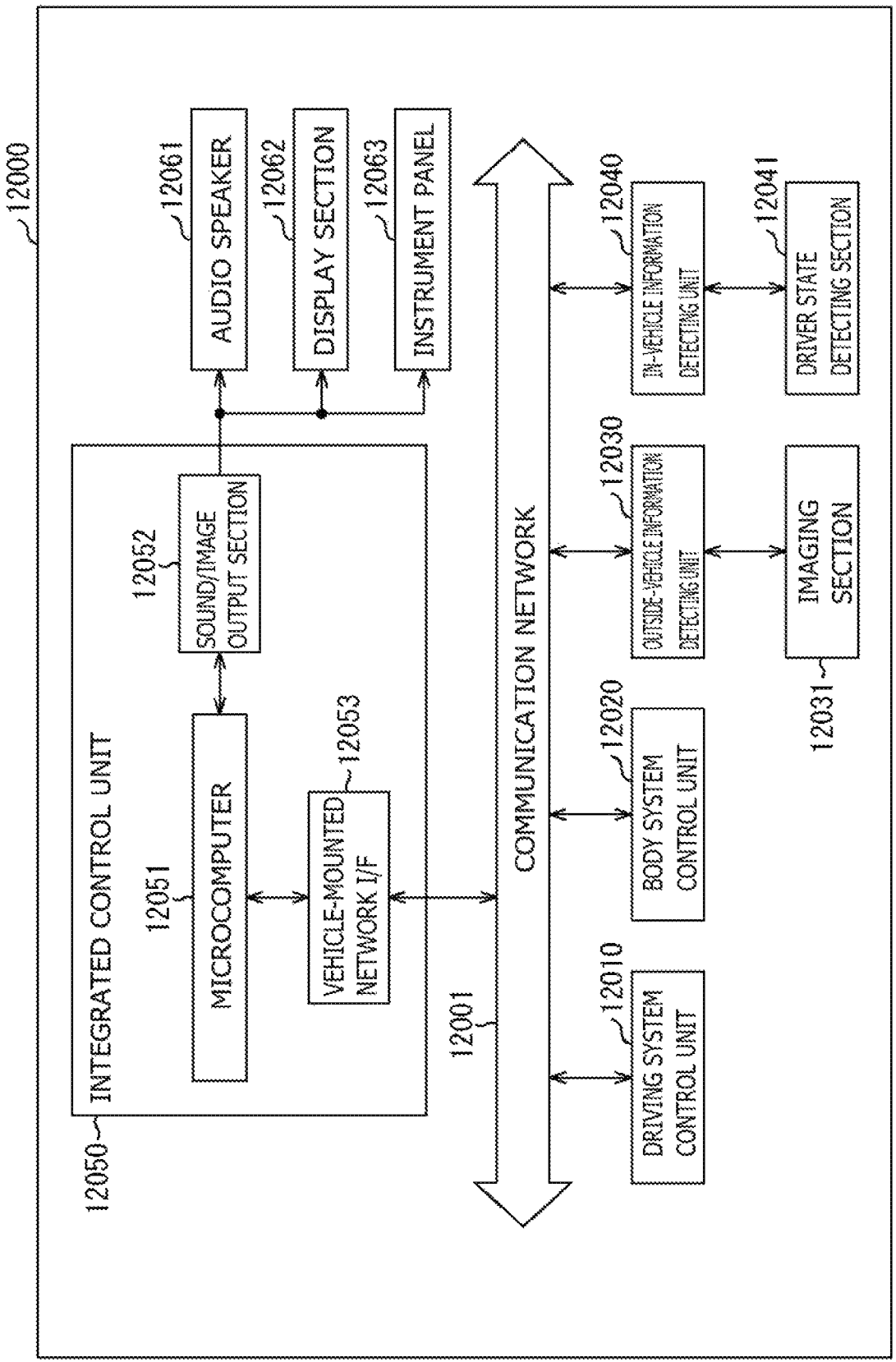
FIG. 22 is a block diagram depicting an example of schematic configuration of a vehicle control system.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
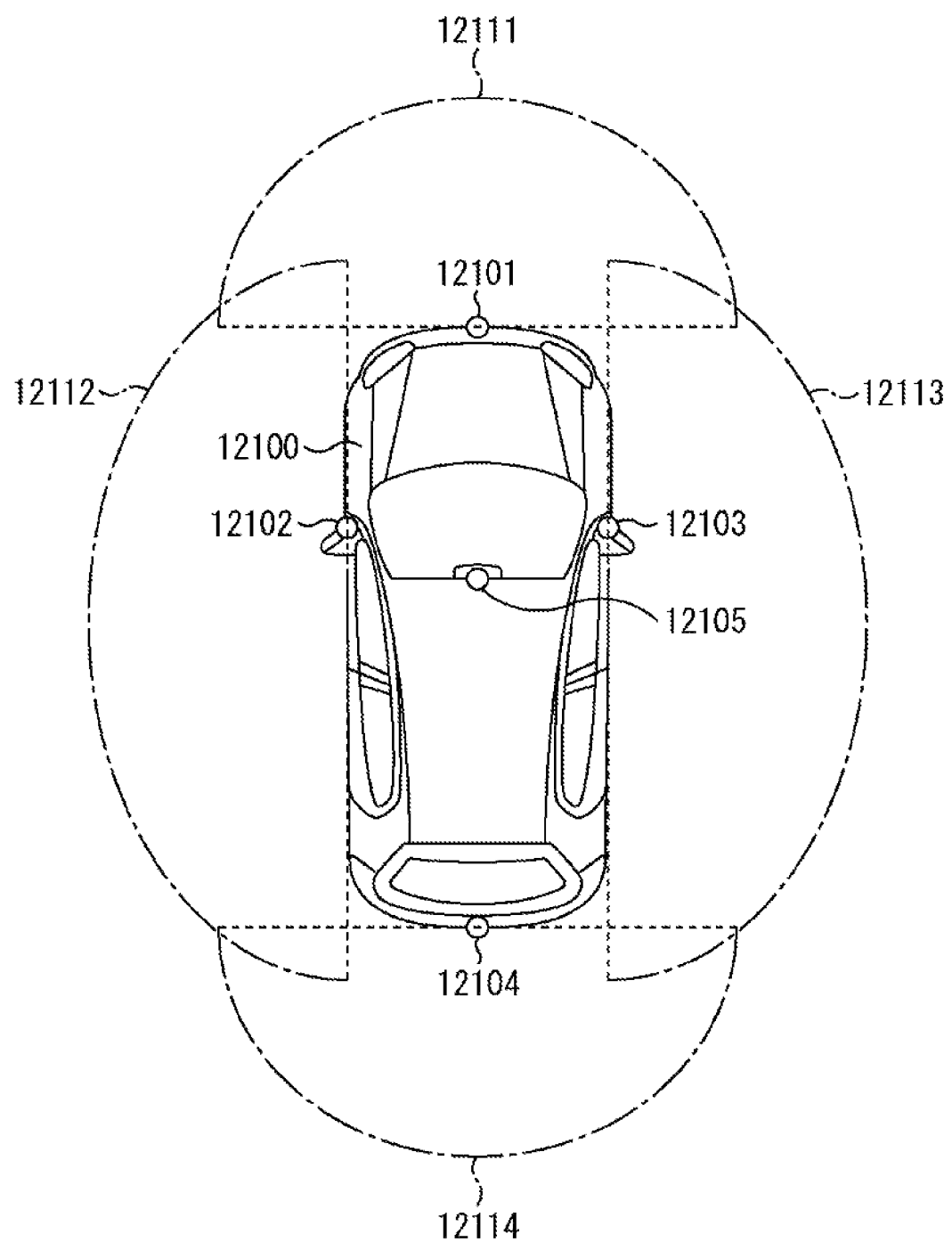
FIG. 23 is a diagram of assistance in explaining an example of installation positions of an outside-vehicle information detecting section and an imaging section.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

5. Working Examples

Next, working examples of the present disclosure are described in detail.

Experiment 1

Experimental Example 1

An ITO film having a thickness of 100 nm was deposited on a quartz substrate with use of a sputtering apparatus. The ITO film was patterned by photolithography and etching to form an ITO electrode (a lower electrode). Subsequently, the quartz substrate provided with the ITO electrode was cleaned by UV/ozone treatment, and thereafter the quartz substrate was moved into a vacuum deposition apparatus, and organic layers were stacked in order on the quartz substrate under a reduced pressure of $1\times10^{-5}$ Pa or less while rotating a substrate holder. First, a film having a thickness of 10 nm was deposited as a hole blocking layer on the ITO electrode with use of NDI-35 represented by the following formula (1) at a substrate temperature of 0° C. to form the hole blocking layer. Next, F6-OPh-26F2 represented by the following formula (2), DPh-BTBT represented by the following formula (3), and $C_{60}$ fullerene represented by the following formula (4) were respectively deposited at a substrate temperature of 40° C. at film deposition rates of 0.50 Å/sec, 0.50 Å/sec, and 0.25 Å/sec to form a mixture layer having a thickness of 230 nm, thereby forming a photoelectric conversion layer. Subsequently, PC-IC represented by the following formula (5) was deposited with a thickness of 10 nm at a substrate temperature of 0° C. to form an electron blocking layer. Next, HATCN represented by the following formula (6) was deposited with a thickness of 10 nm to form a work function adjustment layer. Lastly, the quartz substrate was moved into a sputtering apparatus, and an ITO film having a thickness of 50 nm was deposited on the work function adjustment layer to form an upper electrode. A sample (an experimental example 1) having a 1 mm×1 mm photoelectric conversion region was fabricated through the above fabrication method. The fabricated sample was subjected to annealing treatment at 150° C. for 210 minutes under a nitrogen ($N_2$) atmosphere.

[Chem. 1]

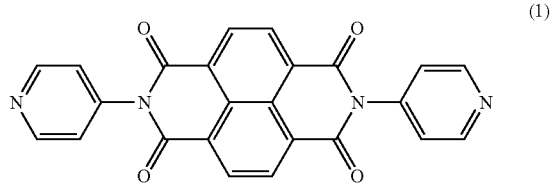

(1)

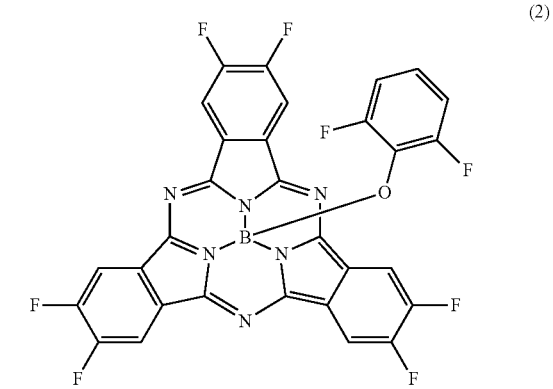

(2)

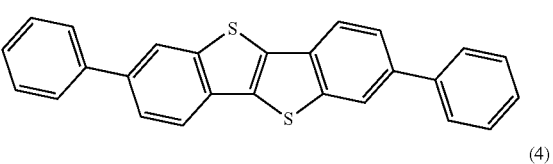

(3)

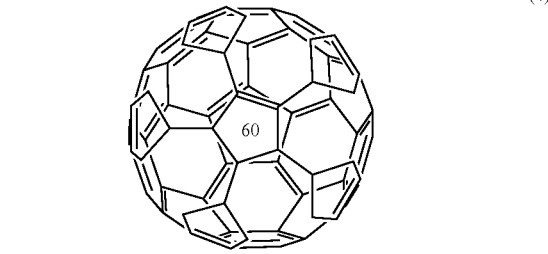

(4)

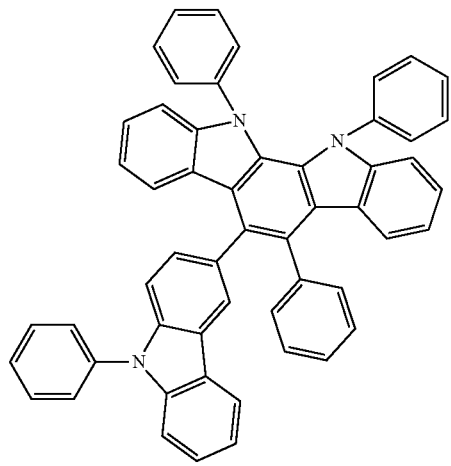

(5)

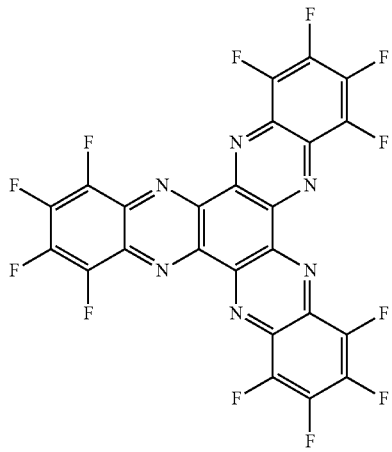

(7)

Experimental Example 4

A sample (an experimental example 4) was fabricated by a method similar to that in the experimental example 1, except that the work function adjustment layer was not provided.

An energy level (a work function or an ionization potential) and a dark current ($J_{dk}$) of each of the work function adjustment layers in the experimental examples 1 to 4 were measured and listed in Table 1. Each evaluation was performed by the following method.

(Evaluation of Energy Level)

A sample in which an ITO film and a single film including each of the materials as measurement targets were deposited on a quartz substrate was formed, and a work function or an electron affinity of the sample were determined by ultraviolet photoelectron spectroscopy (UPS). As for HATCN and F12HATNA, an electron affinity was determined by subtracting an energy gap of an absorption edge in UV-Vis measurement from an ionization potential.

(Evaluation of Dark Current)

As for evaluation of the dark current, a current value was measured in a dark state in a case where a bias voltage to be applied between electrodes of a photoelectric conversion element is controlled with use of a semiconductor parameter analyzer and a voltage to be applied to the lower electrode with respect to the upper electrode was set to −2.6 V. In Table 1, a characteristic value in the experimental example 1 was normalized to 1, and relative comparison was performed.

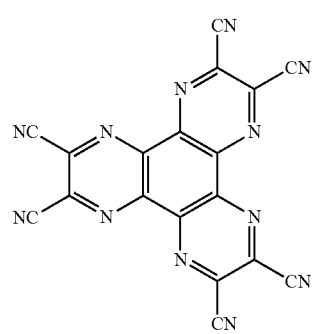

(6)

Experimental Example 2

A sample (an experimental example 2) was fabricated by a method similar to that in the experimental example 1, except that the work function adjustment layer having a thickness of 10 nm was formed by vacuum deposition with use of molybdenum oxide ($MoO_x$) instead of HATCN (the formula (6)) used in the experimental example 1.

Experimental Example 3

A sample (an experimental example 3) was fabricated by a method similar to that in the experimental example 1, except that the work function adjustment layer having a thickness of 10 nm was formed with use of F12HATNA represented by the following formula (7) instead of HATCN (the formula (6)) used in the experimental example 1.

TABLE 1

| | Work Function of Accumulation Electrode | Work Function Adjustment Layer | | Dark Current |
|---|---|---|---|---|
| | | Material | Electron Affinity or Work Function | |
| Experimental Example 1 | 5.5 | Formula (6) | 5.9 | 1 |
| Experimental Example 2 | 5.5 | $MoO_3$ | 6.9 | 1 |

TABLE 1-continued

| | | Work Function Adjustment Layer | |
|---|---|---|---|
| | Work Function of Accumulation Electrode | Material | Electron Affinity or Work Function | Dark Current |
| Experimental Example 3 | 5.5 | Formula (7) | 5.3 | 2.3E+3 |
| Experimental Example 4 | 5.5 | — | — | 6.4 |

Figure 24:
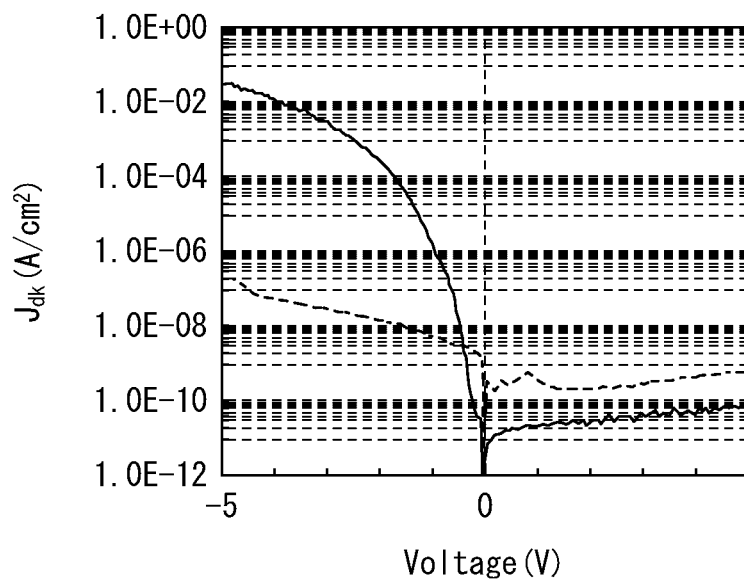
FIG. 24 is a diagram illustrating dark current characteristics in an experimental example 1-1 and an experimental example 1-4.
Figure 25:
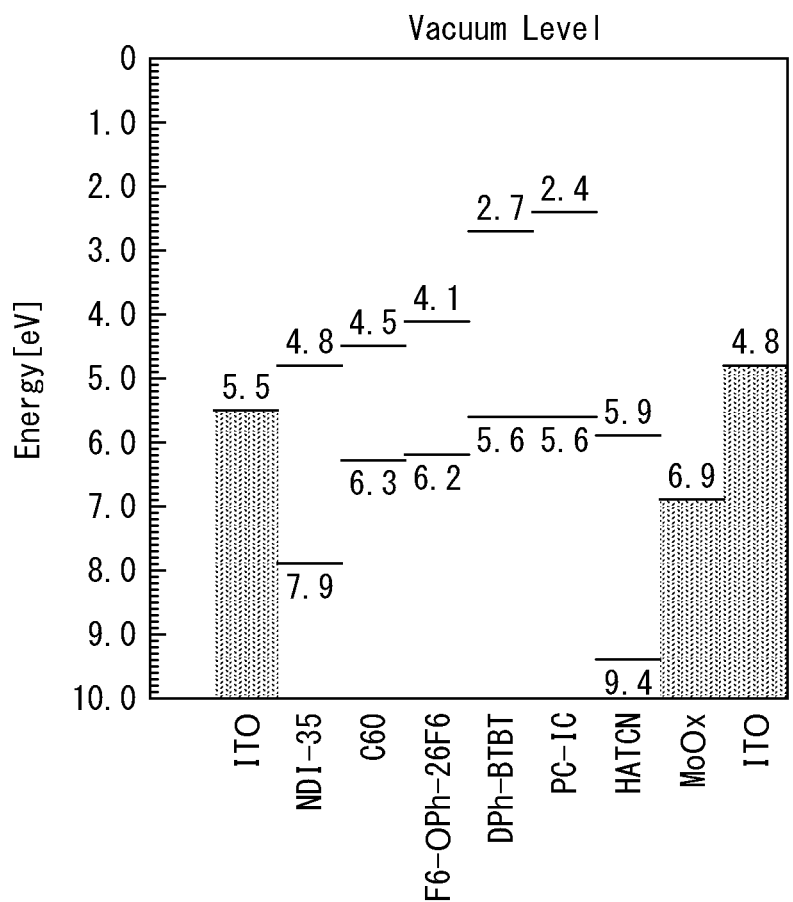
FIG. 25 is a diagram illustrating a relationship of energy levels of respective layers included in each sample in an experiment 1.

FIG. 24 illustrates dark current characteristics in the experimental example 1 and the experimental example 4. FIG. 25 illustrates the energy level of each of the layers included in the respective samples of the experimental examples 1 to 4. As can be seen from Table 1 and FIGS. 24 and 25, in the experimental examples 1 and 2 in which the work function (WFw) or an electron affinity (EAw) of the work function adjustment layer was larger than the work function (WFc) of the lower electrode, the dark currents were equal to each other. In contrast, in the experimental example 3 in which the work function adjustment layer having a work function (WFw) smaller than the work function (WFc) of the lower electrode was provided and in the experimental example 4 in which the work function adjustment layer was not provided, the dark currents were respectively 2.3E+3 and 6.4 that were significantly high, as compared with the dark current in the experimental example 1. As can be seen from the results above, providing the work function adjustment layer having a work function or an electron affinity higher than the work function of the lower electrode causes an internal electric field that causes electrons to move to the lower electrode side to be applied to the photoelectric conversion layer at the time of driving, and causes electrons generated by light irradiation to be rapidly transferred and accumulated into the electric charge accumulation layer, thereby reducing generation of the dark current.

Experiment 2

Imaging elements (samples 1 and 2) that each included a lower electrode including a readout electrode and an accumulation electrode, and a work function adjustment layer between a photoelectric conversion layer and an upper electrode were configured similarly to the above-described embodiment, and a relationship between the number of accumulated electrons to be accumulated in an electric charge accumulation layer and an energy difference (WFw-WFc) between a work function (WFc) of an electric charge accumulation electrode and a work function (WFw) of the work function adjustment layer was measured by device simulation. In the sample 1, the work function (WFc) of the accumulation electrode was 4.8 eV. In the sample 2, the work function (WFc) was 5.2 eV. The work function WFw (or an electron affinity EAw) of each of the work function adjustment layers was changed in steps of 0.1 eV in a range from 4.8 wV to 5.6 eV.

Figure 26:
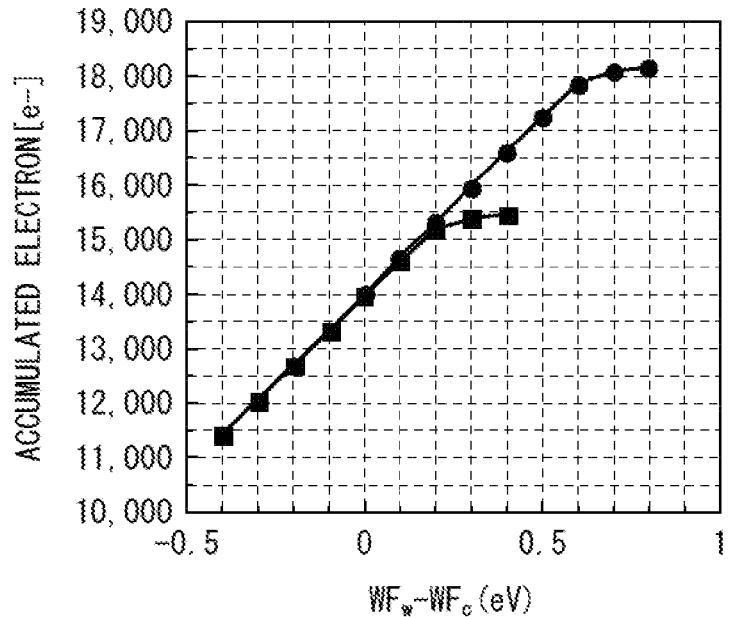
FIG. 26 is a diagram illustrating a relationship between an amount of accumulated electrons accumulated in an electric charge accumulation layer and a difference between a work function (WFw) of a work function adjustment layer and a work function (WFc) of an accumulation electrode in an experiment 2.

FIG. 26 is a plot of simulation results, where a vertical axis indicates the number of accumulated electrons (e−) accumulated in the electric charge accumulation layer and a horizontal axis indicates an energy difference (WFw-WFc) between the accumulation electrode and the work function adjustment layer. As can be seen from FIG. 26, in a case where the work function (WFw) of the work function adjustment layer is larger than the work function (WFc) of the accumulation electrode (WFw≥WFc), the number of accumulated electrons tends to be increased. That is, it was found out that providing, between the photoelectric conversion layer and the upper electrode, the work function adjustment layer having a work function (WFw) higher than the work function (WFc) of the accumulation electrode made it possible to change an internal electric field in the photoelectric conversion layer and rapidly transfer and accumulate electrons generated by light irradiation into the electric charge accumulation layer.

Experiment 3

Experimental Example 5

An ITO film (a lower electrode) having a thickness of 50 nm was deposited on a quartz substrate by a sputtering apparatus, and was subjected to annealing treatment at 250° C. for 30 minutes. Subsequently, the quartz substrate provided with an ITO electrode was cleaned by UV/ozone treatment, and thereafter the quartz substrate was moved into a vacuum deposition apparatus, and an indium-molybdenum composite oxide film (In—Mo—O (In:Mo=70:30)) was deposited on the quartz substrate. Next, an IOT film (an upper electrode) having a thickness of 5 nm was deposited on the composite oxide film, and was subjected to annealing treatment at 150° C. for 5 minutes to thereby fabricate a sample (an experimental example 5).

Experimental Example 6

A sample (an experimental example 6) was fabricated by a method similar to that in the above-described experimental example 5, except that the upper electrode was not formed.

Experimental Example 7

A sample (an experimental example 7) was fabricated by a method similar to that in the experimental example 5, except that molybdenum oxide ($MoO_x$) was deposited instead of indium-molybdenum composite oxide (In—Mo—O (In:Mo=70:30)).

Experimental Example 8

A sample (an experimental example 8) was fabricated by a method similar to that in the above-described experimental example 7, except that the upper electrode was not formed.

Experimental Example 9

An ITO film (a lower electrode) having a thickness of 100 nm was deposited on a quartz substrate with use of a sputtering apparatus. The ITO film was patterned by photolithography and etching to form an ITO electrode (a lower electrode). Subsequently, the quartz substrate provided with the ITO electrode was cleaned by UV/ozone treatment, and thereafter the quartz substrate was moved into a vacuum deposition apparatus, and organic layers were stacked in order on the quartz substrate under a reduced pressure of $1×10^{−5}$ Pa or less while rotating a substrate holder. First, a film having a thickness of 10 nm was deposited as a hole blocking layer on the ITO electrode with use of NDI-35 represented by the following formula (1) at a substrate temperature of 0° C. to form the hole blocking layer. Next, F6-OPh-26F2 represented by the following formula (2), DPh-BTBT represented by the following formula (3), and $C_{60}$ fullerene represented by the following formula (4) were respectively deposited at a substrate temperature of 40° C. at film deposition rates of 0.50 Å/sec, 0.50 Å/sec, and 0.25 Å/sec to form a mixture layer having a thickness of 230 nm, thereby forming a photoelectric conversion layer. Subsequently, PC-IC represented by the following formula (5) was deposited with a thickness of 10 nm at a substrate temperature of 0° C. to form an electron blocking layer. Next, an indium-molybdenum composite oxide film (In—Mo—O (In:Mo=70:30)) having a thickness of 10 nm was deposited to form a work function adjustment layer. Lastly, the quartz substrate was moved into a sputtering apparatus, and an ITO film having a thickness of 50 nm was deposited on the work function adjustment layer to form an upper electrode. A sample (an experimental example 9) having a 1 mm×1 mm photoelectric conversion region was fabricated through the above fabrication method. The fabricated sample was subjected to annealing treatment at 150° C. for 210 minutes under a nitrogen ($N_2$) atmosphere.

Experimental Example 10

A sample (an experimental example 10) was fabricated by a method similar to that in the experimental example 9, except that the thickness of the indium-molybdenum (In—Mo—O (In:Mo=70:30)) composite oxide film used in the experimental example 9 was changed to 50 nm.

Experimental Example 11

A sample (an experimental example 11) was fabricated by a method similar to that in the experimental example 9, except that the work function adjustment layer having a thickness of 10 nm was formed with use of molybdenum oxide ($MoO_x$) instead of indium-molybdenum composite oxide (In—Mo—O (In:Mo=70:30)) used in the experimental example 9.

Experimental Example 12

A sample (an experimental example 12) was fabricated by a method similar to that in the experimental example 11, except that the thickness of molybdenum oxide ($MoO_x$) used in the experimental example 11 was changed to 50 nm.

Experimental Example 13

A sample (an experimental example 13) was fabricated by a method similar to that in the experimental example 9, except that the work function adjustment layer was not provided.

Figure 27:
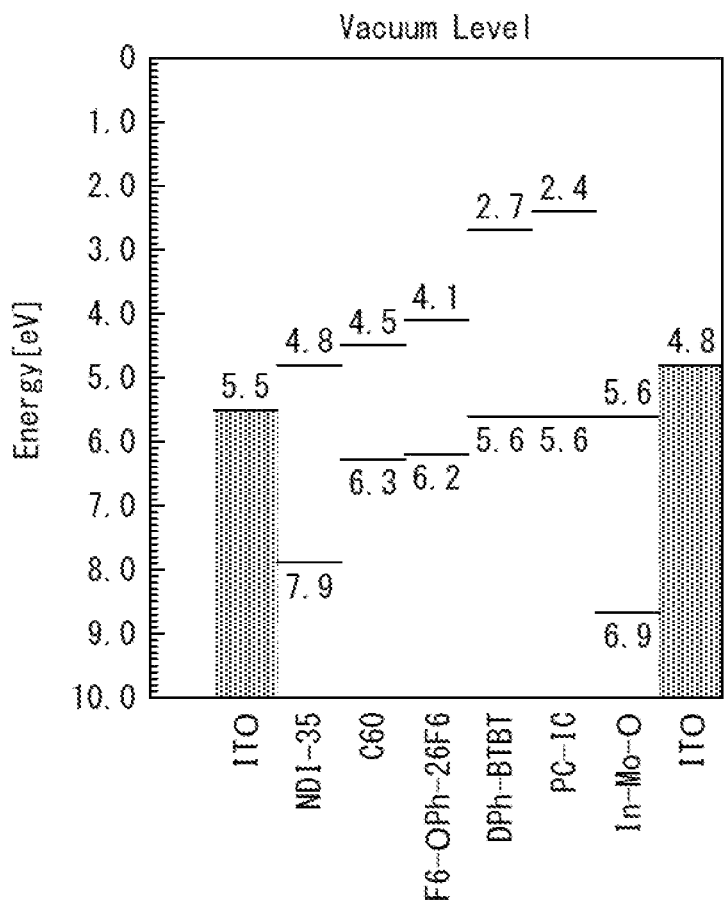
FIG. 27 is a diagram illustrating a relationship of energy levels of respective layers included in an experimental example 9 in an experiment 3.

The experimental examples 5 to 13 were evaluated by the following method, and results thereof are listed in Tables 2 and 3 together with the configurations of the work function adjustment layers used in the respective experimental examples 5 to 13. It is to be noted that respective characteristics values in the experimental example 5 and the experimental example 9 were normalized to 1, and absorptances at a wavelength of 700 nm in Table 2 and Table 3 and respective characteristic results in Table 3 were listed as relative values thereof. FIG. 27 illustrates an energy level of each of layers included in the experimental example 9.

(XPS Measurement)

As for the samples fabricated in the experimental examples 5 to 8, the samples were irradiated with X rays to detect electrons corresponding to energy levels of $3d_{3/2}$ and $3d_{5/2}$ of molybdenum (Mo) in a solid. Chemical shifts associated with a valence change in Mo observed at $Mo^{6+}$ (235.8 eV and 232.7 eV) and $Mo^{5+}$ (235.0 eV and 231.7 eV) were used to calculate an abundance ratio of the valence of molybdenum (Mo) in each of the experimental examples by fitting.

(Absorptance Measurement)

An absorption spectrum of each of the samples fabricated in the experimental examples 5 to 8 was measured with use of an ultraviolet-visible spectrophotometer. In addition, an absorption spectrum of a sample with a 1 inch square size in which a silicon substrate of a sample (a photoelectric device for simple evaluation) fabricated in each of the experimental examples 9 to 13 was changed to a quartz substrate was measured with use of an ultraviolet-visible spectrophotometer.

(Evaluation of Energy Level)

A film including ITO having a thickness of 50 nm was deposited on a quartz substrate with use of a sputtering apparatus, and was subjected to annealing treatment at 250° C. for 30 minutes. The substrate was cleaned by UV/ozone treatment, and thereafter a sample in which indium-molybdenum composite oxide (In—Mo—O (In:Mo=70:30)) or molybdenum oxide ($MoO_x$) was deposited with a thickness of 10 nm was fabricated, and a work function of the sample was determined by ultraviolet photoelectron spectroscopy (UPS).

(Evaluation of Device Characteristics)

Device characteristics of photoelectric devices for simple evaluation fabricated in the experimental examples 9 to 13 were evaluated.

(Evaluation of Dark Current)

As for evaluation of the dark current, a current value was measured in a dark state in a case where a bias voltage to be applied between electrodes of the photoelectric device for simple evaluation is controlled with use of a semiconductor parameter analyzer and a voltage to be applied to the lower electrode with respect to the upper electrode was set to 2.6 V, similarly to evaluation of the dark current in the experiment 1.

(Evaluation of External Quantum Efficiency (EQE))

As for evaluation of EQE, the number of effective carriers was determined by subtracting a dark current value from a light current value in a case where a voltage to be applied to the lower electrode with respect to the upper electrode was set to 2.6 V, and EQE was calculated by dividing the number of effective carriers by the number of incident photons. It is to be noted that a wavelength of light to be applied from a light source to the device through a filter was 560 nm, a light amount of the light was 1.62 µW/cm², and a bias voltage to be applied between electrodes of the device was controlled with use of a semiconductor parameter analyzer.

(Evaluation of Response Time)

As for evaluation of response time, a current by a light pulse was observed in a state in which a rectangular pulse type light on/off signal was applied, and a bias and a voltage of 2.6 V were applied to the lower electrode with respect to the upper electrode, and thereafter a period of time until an amount of electric charges flowed during current attenuation when light was turned off was attenuated to 3% of the amount of electric charges flowing to an external circuit during light irradiation was used as an index of responsivity. At that time, the amount of light when the light was turned on was 1.62 µW/cm². It is to be noted that a wavelength of light to be applied from the light source to the device through the filter was 560 nm, and a light emitting diode (LED) coupled to a function generator was used as the light source.

TABLE 2

| | Material of Work Function Adjustment Layer | Presence or Absence of Upper Electrode | Abundance Ratio of Mo + 6 (%) | Abundance Ratio of Mo + 5 (%) | Absorptance at 700 nm (%) |
|---|---|---|---|---|---|
| Experimental Example 5 | In—Mo—O | Presence | 93 | 7 | 1.0 |
| Experimental Example 6 | In—Mo—O | — | 95 | 5 | 0.6 |
| Experimental Example 7 | MoOx | Presence | 54 | 46 | 7.6 |
| Experimental Example 8 | MoOx | — | 92 | 8 | 1.1 |

TABLE 3

| | Work Function Adjustment Layer | | | | Dark | | Response |
|---|---|---|---|---|---|---|---|
| | Material | Work Function | Film Thickness (nm) | Absorptance at 700 nm (%) | Current Relative Value | EQE Relative Value | Time Relative Value |
| Experimental Example 9 | In—Mo—O | 5.6 | 10 | 1.0 | 1.0 | 1.0 | 1.0 |
| Experimental Example 10 | In—Mo—O | N/A | 50 | 2.8 | 1.05 | 0.99 | 1.02 |
| Experimental Example 11 | $MoO_X$ | 6.9 | 10 | 5.3 | 1.32 | 0.93 | 1.13 |
| Experimental Example 12 | $MoO_X$ | N/A | 50 | 16 | 1.21 | 0.85 | 1.35 |
| Experimental Example 13 | w/o | — | — | 0.8 | $10^8$ | N/A | N/A |

In the experimental examples 5 and 6 that included the work function adjustment layer including indium-molybdenum composite oxide (In—Mo—O (In:Mo=70:30)), irrespective of the presence or absence of the ITO film formed above (the upper electrode, hereinafter referred to as an upper ITO film), the absorptance at a wavelength of 700 nm was in the neighborhood of 1 in relative value that was low. In contrast, in the experimental examples 7 and 8 that included the work function adjustment layer including molybdenum oxide ($MoO_x$) as a simple oxide, in a case where the upper ITO film was not provided (the experimental example 8), the absorption at a wavelength of 700 nm was substantially equal to that in the experimental examples 5 and 6, but in the experimental example 8 in which the upper ITO film was formed, the absorptance at a wavelength of 700 nm was increased to 7.6 in relative value.

It is conceivable that this was caused by a ratio of a high oxidation state (molybdenum ($Mo^{+6}$) having an oxidation number of +6) included in the work function adjustment layer. In the experimental examples 5, 6, and 8, the ratio of molybdenum ($Mo^{+6}$) having an oxidation number of +6 in the high oxidation state included in the work function adjustment layer was 90% or more that was large, and a ratio of molybdenum ($Mo^{+5}$) having an oxidation number of +5 in a low oxidation state was less than 10% that was small. In the experimental example 7, the ratio of molybdenum ($Mo^{+6}$) having an oxidation number of +6 in the high oxidation state was decreased to 54%, and the ratio of molybdenum ($Mo^{+5}$) having an oxidation number of +5 in the low oxidation state was increased to 46%. As a result, it is conceivable that in the experimental example 7, an absorptance at a wavelength of 700 nm derived from molybdenum ($Mo^{+5}$) having an oxidation number of +5 was increased.

It is conceivable that change in the ratio of the above oxidation states is caused by presence or absence of damage by sputtering for formation of the upper ITO film. That is, in the work function adjustment layer including molybdenum oxide ($MoO_x$) as a metal oxide having a single composition in the experimental example 7, molybdenum ($Mo^{+5}$) having an oxidation number of +5 in the low oxidation state was increased by an influence of damage by sputtering for formation of the upper ITO film. In contrast, it is conceivable that the work function adjustment layer including indium-molybdenum composite oxide (In—Mo—O (In:Mo=70:30)) as a metal oxide having a composite metal composition in the experimental example 5 was hardly affected by an influence by sputtering of the upper ITO film, which allowed the oxidation number of molybdenum to be maintained in the high oxidation state of the oxidation number of +6. It is presumed that a reason for this is that the state of the oxidation number of +6 ($Mo^{6+}$) was stabilized by physical covering of surroundings of molybdenum (Mo) with indium (In) and chemical interaction of molybdenum (Mo) and indium (In).

In the experimental examples 9 to 13 in which photoelectric devices for simple evaluation were fabricated, the following results were obtained.

In the experimental example 9 in which the work function adjustment layer including indium-molybdenum composite oxide (In—Mo—O (In:Mo=70:30)) and having a thickness of 10 nm was formed, absorption derived from molybdenum ($Mo^{+5}$) having an oxidation number of +5 at 700 nm was 1 in relative value, and a relatively superior dark current, relatively superior EQE, and relatively superior response time were exhibited. In the experimental example 10 that included the work function adjustment layer including indium-molybdenum composite oxide (In—Mo—O (In:Mo=70:30)) and having a thickness of 50 nm, absorption derived from molybdenum ($Mo^{+5}$) having an oxidation number of +5 at 700 nm was 2.8 in relative value, and a relatively superior dark current, relatively superior EQE, and relatively superior response time were exhibited, similarly to the experimental example 9.

In contrast with the experimental examples 9 and 10, in the experimental example 11 in which the work function adjustment layer including molybdenum oxide ($MoO_x$) and having a thickness of 10 nm was formed, absorption derived from molybdenum ($Mo^{+5}$) having an oxidation number of +5 at 700 nm was 5.3 in relative value that was slightly high, and the dark current was increased, EQE was decreased, and the response time was increased. In the experimental example 12 in which the work function adjustment layer including molybdenum oxide ($MoO_x$) and having a thickness of 50 nm was formed, absorption derived from molybdenum ($Mo^{+5}$) having an oxidation number of +5 at 700 nm was 16 in relative value that was high, and the dark current was increased, EQE was decreased, and the response time was increased. In the experimental example 13 in which the work function adjustment layer was not formed, the dark current was greatly increased, and EQE and the response time were not measurable.

In addition, in comparison between the experimental example 9 and experimental example 11, while in molybdenum oxide ($MoO_x$) that was a metal oxide with a single composition, absorption derived from molybdenum (Mo) in the low oxidation state was increased by an influence of damage by sputtering of the upper ITO film, indium-molybdenum composite oxide (In—Mo—O) that was a metal oxide with a composite metal composition was hardly affected by the influence by sputtering of the upper ITO film, and molybdenum (Mo) in the high oxidation state was maintained. It is conceivable that as described above, a reason for this is that the state of molybdenum ($Mo^{6+}$) having an oxidation number of +6 was stabilized by physical covering of surroundings of molybdenum (Mo) with indium (In) and chemical interaction of molybdenum (Mo) and indium (In).

Further, in comparison between the experimental example 9 and the experimental example 10, in indium-molybdenum composite oxide (In—Mo—O) that was a metal oxide with a composite metal composition, significant deterioration in device characteristics caused by an increase in film thickness was not observed. In contrast, in comparison between the experimental example 11 and the experimental example 12, in molybdenum oxide ($MoO_x$) that was a metal oxide with a single composition, deterioration in EQE and response time caused by an increase in film thickness was confirmed. In comparison of the influence of an increase in film thickness, while deterioration in characteristics was observed in molybdenum oxide ($MoO_x$), significant deterioration in characteristics was not observed in indium-molybdenum composite oxide (In—Mo—O).

It is conceivable that a reason for this is that indium-molybdenum composite oxide (In—Mo—O) has mobility higher than molybdenum oxide ($MoO_x$). It is presumed that in indium-molybdenum composite oxide (In—Mo—O), indium (In) that forms a conduction band has a large unoccupied s-orbital overlap, which influences high mobility. Indium-molybdenum composite oxide (In—Mo—O) that is a metal oxide with a composite metal composition has an appropriately high work function, stability of the oxidation state, and conduction physical property of high mobility. Accordingly, forming the work function adjustment layer using indium-molybdenum composite oxide (In—Mo—O) similarly to the experimental example 9 and the experimental example 10 allows an internal electric field of a device to be controlled to a direction where electrons flow to the lower electrode side, thereby improving the dark current, EQE, and afterimage characteristics. As a result, transfer efficiency to the electric charge accumulation layer is improved, and an accumulated electric charge amount Qs is enhanced. That is, image quality of an imaging element is improved.

Experiment 4

Experimental Example 14

A sample (an experimental example 14) of a photoelectric device for simple evaluation was fabricated similarly to the above-described experimental example 1, except that a hole blocking layer was formed using F6-OPh-26F2 represented by the above-described formula (2) and $C_{60}$ fullerene represented by the above-described formula (4) and a exciton blocking layer having a thickness of 10 nm was formed using PC-IC2 represented by the following formula (8) between the photoelectric conversion layer and the work function adjustment layer, and EQE of the sample was evaluated.

[Chem. 3]

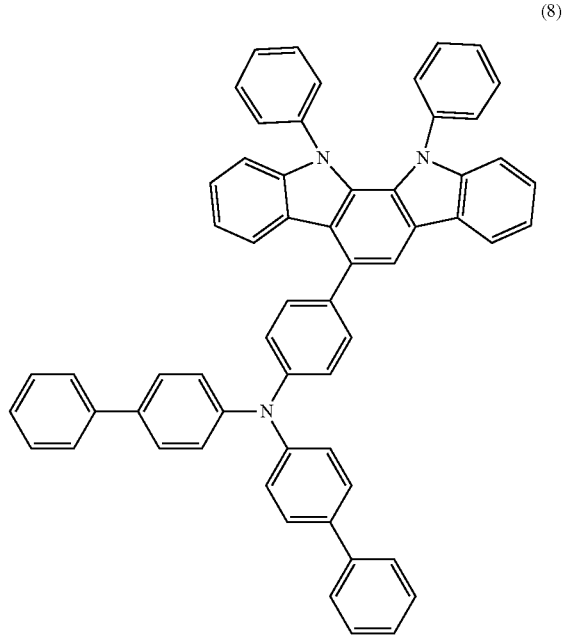

(8)

Experimental Example 15

A sample (an experimental example 15) of a photoelectric device for simple evaluation was fabricated by a method similar to that in the experimental example 14, except that the exciton blocking layer formed in the experimental example 14 was removed, and EQE of the sample was evaluated.

Figure 28:
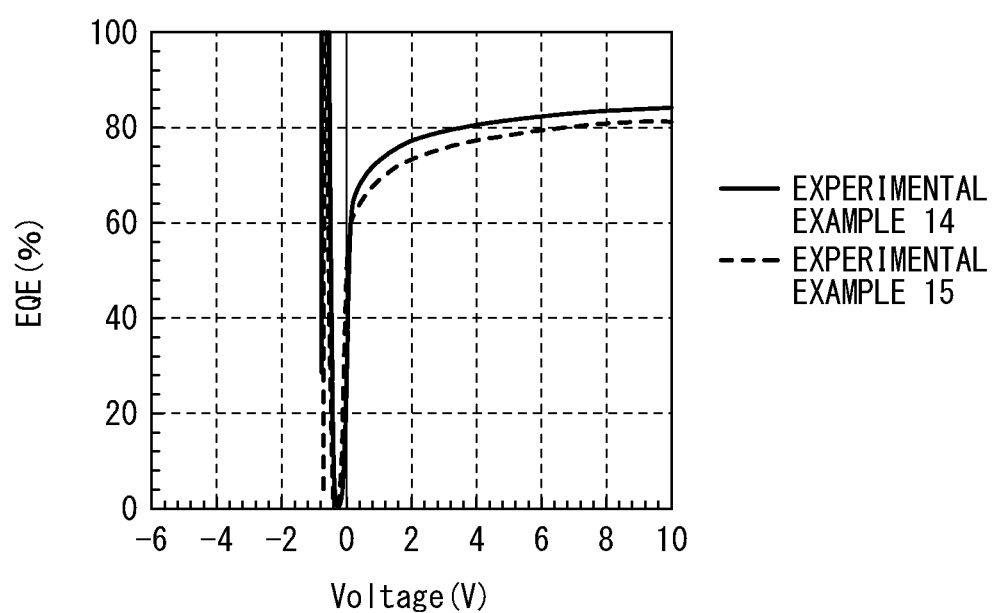
FIG. 28 is a diagram illustrating EQE characteristics in an experiment 4.

FIG. 28 illustrates EQE characteristics of the experimental example 14 and the experimental example 15. While EQE of the experimental example 15 in which the exciton blocking layer was not provided was 75%, EQE of the experimental example 14 in which the exciton blocking layer was provided was increased to 79%. It was found out that providing the exciton blocking layer between the photoelectric conversion layer and the work function adjustment layer made it possible to improve EQE.

Although the description has been given by referring to the embodiment, the modification examples 1 to 3, and the working examples, the contents of the present disclosure are not limited to the above-described embodiment and the like, and may be modified in a variety of ways. For example, in the above-described embodiment, the imaging element has a configuration in which the organic photoelectric converter 20 detecting green light and the inorganic photoelectric converters 32B and 32R respectively detecting blue light and red light are stacked; however, the contents of the present disclosure is not limited to such a configuration. That is, the organic photoelectric converter may detect red light or blue light, and the inorganic photoelectric converter may detect green light.

In addition, the number of organic photoelectric converters, the number of inorganic photoelectric converters, a ratio between the organic photoelectric converters and the inorganic photoelectric converters are not limited, and two or more organic photoelectric converters may be provided, or color signals of a plurality of colors may be acquired only by the organic photoelectric converter.

Furthermore, in the above-described embodiment, an example in which two electrodes, that is, the readout electrode 21A and the accumulation electrode 21B are provided as a plurality of electrodes included in the lower electrode 21 has been described; however, three, or four or more electrodes such as a transfer electrode or an ejection electrode may be provided.

It is to be noted that the effects described herein are merely illustrative and non-limiting, and other effects may be included.

It is to be noted that the present disclosure may have the following configurations.

(1)
An imaging element including:
a first electrode including a plurality of electrodes;
a second electrode opposed to the first electrode;
a photoelectric conversion layer including an organic material provided between the first electrode and the second electrode;
a first semiconductor layer provided between the first electrode and the photoelectric conversion layer, and including an n-type semiconductor material; and
a second semiconductor layer provided between the second electrode and the photoelectric conversion layer, and including at least one of a carbon-containing compound having an electron affinity larger than a work function of the first electrode or an inorganic compound having a work function larger than the work function of the first electrode.

(2)
The imaging element according to (1), in which the first electrode includes an electric charge readout electrode and an electric charge accumulation electrode as the plurality of electrodes.

(3)
The imaging element according to (1) or (2), in which a work function of the second electrode is smaller than a work function of the second semiconductor layer.

(4)
The imaging element according to any one of (1) to (3), in which the second semiconductor layer includes, as the inorganic compound, an inorganic oxide having a single composition.

(5) The imaging element according to any one of (1) to (4), in which the second semiconductor layer includes, as the inorganic compound, a composite oxide including at least one kind of transition metal element and at least one kind of typical metal element.

(6)
The imaging element according to (5), in which the transition metal element includes at least one kind of molybdenum, tungsten, vanadium, chromium, nickel, or rhenium, and the typical metal element includes at least one kind of indium, zinc, tin, or gallium.

(7)
The imaging element according to (5) or (6), in which the composite oxide includes the transition metal element within a range of 20 wt % to 80 wt % both inclusive and the typical metal element within a range of 20 wt % to 80 wt % both inclusive.

(8)
The imaging element according to any one of (2) to (7), in which a work function of the second semiconductor layer is larger than a work function of the electric charge accumulation electrode.

(9)
The imaging element according to any one of (6) to (8), in which the second semiconductor layer includes, as the transition metal element, at least one kind of molybdenum having an oxidation number of +6, tungsten having an oxidation number of +6, vanadium having an oxidation number of +5, chromium having an oxidation number of +6, nickel having an oxidation number of +4, or rhenium having an oxidation number of +6 and +7.

(10)
The imaging element according to any one of (1) to (9), in which light absorptance for visible light of the second semiconductor layer is 10% or less.

(11)
The imaging element according to any one of (1) to (10), in which the first semiconductor layer includes an oxide semiconductor material, and the oxide semiconductor material has, at a bottom of a conduction band, an energy level shallower than the work function of the first electrode.

(12)
The imaging element according to any one of (1) to (11), further including a third semiconductor layer between the photoelectric conversion layer and the second semiconductor layer.

(13)
The imaging element according to (12), in which the third semiconductor layer includes an organic compound or an inorganic compound having a band gap larger than a band gap of the organic material included in the photoelectric conversion layer.

(14)
The imaging element according to (12) or (13), in which the third semiconductor layer has an energy level shallower than a HOMO of the second semiconductor layer, has an energy level shallower than a HOMO of the photoelectric conversion layer, and further has an energy level deeper than a work function of the second electrode.

(15)
The imaging element according to (13) or (14), in which the organic compound has a glass transition point higher than 100° C.

(16)
The imaging element according to any one of (2) to (15), further including an insulating layer between the first electrode and the first semiconductor layer, in which the electric charge readout electrode is electrically coupled to the first semiconductor layer via an opening provided in the insulating layer.

(17)

The imaging element according to any one of (1) to (16), in which a voltage is separately applied to each of the plurality of electrodes.

(18)

The imaging element according to any one of (1) to (17), in which one or a plurality of organic photoelectric converters that include the photoelectric conversion layer, and one or a plurality of inorganic photoelectric converters that performs photoelectric conversion in a wavelength region different from the organic photoelectric converters are stacked.

(19)

An imaging apparatus provided with a plurality of pixels each including one or a plurality of imaging elements, the imaging elements each including:

a first electrode including a plurality of electrodes;

a second electrode opposed to the first electrode;

a photoelectric conversion layer including an organic material provided between the first electrode and the second electrode;

a first semiconductor layer provided between the first electrode and the photoelectric conversion layer, and including an n-type semiconductor material; and a second semiconductor layer provided between the second electrode and the photoelectric conversion layer, and including at least one of a carbon-containing compound having an electron affinity larger than a work function of the first electrode or an inorganic compound having a work function larger than the work function of the first electrode.

(20)

The imaging apparatus according to (19), in which the first electrode is formed for each of the pixels, and includes the plurality of electrodes in the pixel.

This application claims the benefit of Japanese Priority Patent Application JP2018-142497 filed with the Japan Patent Office on Jul. 30, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging element, comprising:
a first electrode including a plurality of electrodes;
a second electrode opposed to the first electrode;
a photoelectric conversion layer including an organic material provided between the first electrode and the second electrode;
a first semiconductor layer provided between the first electrode and the photoelectric conversion layer, and including an n-type semiconductor material; and
a second semiconductor layer provided between the second electrode and the photoelectric conversion layer, and including at least one of a carbon-containing compound having an electron affinity larger than a work function of the first electrode or an inorganic compound having a work function larger than the work function of the first electrode, wherein the second semiconductor layer includes, as the inorganic compound, a composite oxide including at least one kind of transition metal element and at least one kind of typical metal element.

2. The imaging element according to claim 1, wherein the first electrode includes an electric charge readout electrode and an electric charge accumulation electrode as the plurality of electrodes.

3. The imaging element according to claim 1, wherein a work function of the second electrode is smaller than a work function of the second semiconductor layer.

4. The imaging element according to claim 1, wherein the second semiconductor layer includes, as the inorganic compound, an inorganic oxide having a single composition.

5. The imaging element according to claim 1, wherein the transition metal element includes at least one kind of molybdenum, tungsten, vanadium, chromium, nickel, or rhenium, and the typical metal element includes at least one kind of indium, zinc, tin, or gallium.

6. The imaging element according to claim 1, wherein the composite oxide includes the transition metal element within a range of 20 wt % to 80 wt % both inclusive and the typical metal element within a range of 20 wt % to 80 wt % both inclusive.

7. The imaging element according to claim 1, wherein light absorptance for visible light of the second semiconductor layer is 10% or less.

8. The imaging element according to claim 1, wherein
the first semiconductor layer includes an oxide semiconductor material, and
the oxide semiconductor material has, at a bottom of a conduction band, an energy level shallower than the work function of the first electrode.

9. The imaging element according to claim 1, further comprising a third semiconductor layer between the photoelectric conversion layer and the second semiconductor layer.

10. The imaging element according to claim 1, wherein a voltage is individually applied to each of the plurality of electrodes.

11. The imaging element according to claim 1, wherein one or a plurality of organic photoelectric converters that include the photoelectric conversion layer, and one or a plurality of inorganic photoelectric converters that performs photoelectric conversion in a wavelength region different from the organic photoelectric converters are stacked.

12. The imaging element according to claim 2, wherein a work function of the second semiconductor layer is larger than a work function of the electric charge accumulation electrode.

13. The imaging element according to claim 2, further comprising an insulating layer between the first electrode and the first semiconductor layer, wherein
the electric charge readout electrode is electrically coupled to the first semiconductor layer via an opening provided in the insulating layer.

14. The imaging element according to claim 5, wherein the second semiconductor layer includes, as the transition metal element, at least one kind of molybdenum having an oxidation number of +6, tungsten having an oxidation number of +6, vanadium having an oxidation number of +5, chromium having an oxidation number of +6, nickel having an oxidation number of +4, or rhenium having an oxidation number of +6 and +7.

15. An imaging element, comprising:
a first electrode including a plurality of electrodes;
a second electrode opposed to the first electrode;
a photoelectric conversion layer including an organic material provided between the first electrode and the second electrode;
a first semiconductor layer provided between the first electrode and the photoelectric conversion layer, and including an n-type semiconductor material;
a second semiconductor layer provided between the second electrode and the photoelectric conversion layer, and including at least one of a carbon-containing compound having an electron affinity larger than a work function of the first electrode or an inorganic compound having a work function larger than the work function of the first electrode; and
a third semiconductor layer between the photoelectric conversion layer and the second semiconductor layer,
wherein the third semiconductor layer includes an organic compound or an inorganic compound having a band gap larger than a band gap of the organic material included in the photoelectric conversion layer.

16. The imaging element according to claim 15, wherein the organic compound has a glass transition point higher than 100° C.

17. An imaging element, comprising:
a first electrode including a plurality of electrodes;
a second electrode opposed to the first electrode;
a photoelectric conversion layer including an organic material provided between the first electrode and the second electrode;
a first semiconductor layer provided between the first electrode and the photoelectric conversion layer, and including an n-type semiconductor material;
a second semiconductor layer provided between the second electrode and the photoelectric conversion layer, and including at least one of a carbon-containing compound having an electron affinity larger than a work function of the first electrode or an inorganic compound having a work function larger than the work function of the first electrode; and
a third semiconductor layer between the photoelectric conversion layer and the second semiconductor layer,
wherein the third semiconductor layer has an energy level shallower than a HOMO of the second semiconductor layer, has an energy level shallower than a HOMO of the photoelectric conversion layer, and further has an energy level deeper than a work function of the second electrode.

* * * * *